(12) United States Patent
Takiba et al.

(10) Patent No.: US 7,214,922 B2
(45) Date of Patent: May 8, 2007

(54) SEMICONDUCTOR PHOTOSENSOR DEVICE AND INFORMATION APPARATUS WITH SENSITIVITY REGION FOR WIDE DYNAMIC RANGE

(75) Inventors: Yukiko Takiba, Kawasaki (JP); Hiroshi Suzunaga, Kawasaki (JP); Hideyuki Mori, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 11/215,229

(22) Filed: Aug. 31, 2005

(65) Prior Publication Data

US 2006/0060757 A1   Mar. 23, 2006

(30) Foreign Application Priority Data

Sep. 17, 2004   (JP)   ............................. 2004-271300
Sep. 17, 2004   (JP)   ............................. 2004-271393

(51) Int. Cl.
  *G01J 1/44*  (2006.01)
  *G01J 1/42*  (2006.01)
  *H03K 17/78*  (2006.01)

(52) U.S. Cl. ............... 250/208.4; 250/208.2; 250/214 R; 250/214 SW; 250/214 L

(58) Field of Classification Search ............. 250/208.2, 250/208.4, 214.1, 214 R, 214 SW, 208.1, 250/214 L
See application file for complete search history.

(56) References Cited

U.S. PATENT DOCUMENTS

| 4,914,283 | A | * | 4/1990 | Brinckmann et al. .... 250/206.1 |
| 5,340,977 | A | * | 8/1994 | Kojima et al. ........... 250/208.1 |
| 5,789,737 | A | * | 8/1998 | Street ...................... 250/208.1 |
| 6,028,299 | A | * | 2/2000 | Hirama et al. ........... 250/208.1 |
| 6,504,142 | B2 | * | 1/2003 | Nixon et al. ............. 250/214 C |
| 6,710,317 | B2 | * | 3/2004 | Meadows ................... 250/205 |
| 6,831,344 | B2 | | 12/2004 | Ogawa et al. |
| 7,026,596 | B2 | * | 4/2006 | Fossum ................... 250/208.1 |
| 2003/0122956 | A1 | | 7/2003 | Sugimoto et al. |
| 2005/0051704 | A1 | | 3/2005 | Kashiura et al. |

FOREIGN PATENT DOCUMENTS

| JP | 63-61923 | 3/1988 |
| JP | 5-14805 | 1/1993 |
| JP | 5-63572 | 3/1993 |
| JP | 6-294874 | 10/1994 |

* cited by examiner

*Primary Examiner*—Stephone B. Allen
*Assistant Examiner*—Davienne Monbleau
(74) *Attorney, Agent, or Firm*—Oblon, Spivak, McClelland, Maier & Neustadt, P.C.

(57) ABSTRACT

A semiconductor photosensor device includes a plurality of photodiode sections, a switch, and an output section is provided. The plurality of photodiode sections have different illuminance-output characteristics. The switch selects any one of the plurality of photodiodes sections on the basis of an illuminance of incident light irradiated on the photodiode sections. The output section outputs an signal from the selected photodiode section through the switch.

24 Claims, 23 Drawing Sheets

| STATE | ILLUMINANCE | OUTPUT 1 | OUTPUT 2 |
|---|---|---|---|
| 1 | X < DETECTED ILLUMINANCE 1 | 0 | 0 |
| 2 | DETECTED ILLUMINANCE 1 < X < DETECTED ILLUMINANCE 2 | 0 | 1 |
| 3 | DETECTED ILLUMINANCE 2 < X | 1 | 1 |

SEMICONDUCTOR PHOTOSENSOR DEVICE AND INFORMATION APPARATUS WITH SENSITIVITY REGION FOR WIDE DYNAMIC RANGE

CROSS-REFERENCE TO RELATED APPLICATIONS

This application is based upon and claims the benefit of priority from the prior Japanese Patent Applications No. 2004-271300, filed on Sep. 17, 2004, and No. 2004-271393, filed on Sep. 17, 2004 the entire contents of which are incorporated herein by references.

BACKGROUND OF THE INVENTION

1. Field of the Invention

The present invention relates to a semiconductor photosensor device for an illuminance sensor, for example, a semiconductor photosensor device which can detect an illuminance falling in a wide range of several lux to several tens of thousand lux.

2. Related Art

A semiconductor photosensor device (illuminance sensor) is a photosensor which outputs a linear output depending on an ambient illuminance (brightness). Mainly in a mobile phone, the illuminance sensor is mainly used for ON/OFF control of LEDs (Light Emitting Diodes) of a back light or an operation unit (key unit) of a liquid crystal screen depending on an ambient illuminance (brightness). For example, the illuminance sensor turns off some light emitting diodes of the back light or the key unit when the ambience is brought and turns on the light emitting diodes or performs brightness control or the like to suppress unnecessary power consumption when the ambience is dark.

An illuminance sensor of a conventional mobile phone has been used for ON/OFF control of light emitting diodes of a key unit. Therefore, such illuminance sensor is designed to output a linear output within a low-illuminance range of several lux to hundred lux.

At the present, not only ON/OFF control of light emitting diodes of a key unit, but also control of the back light of a liquid crystal screen are demanded. This is because a power consumption increases due to the advance of full-color liquid crystal of mobile phones. Since a transmissive liquid crystal screen uses a back light on the back side of the screen as a light source, a chroma saturation is high. For this reason, the transmissive liquid crystal screen can be easily viewed in a dark room, but the screen is dark in a bright room. In order to cope with this drawback, the back light is controlled depending on ambient brightness. A high illuminance up to several tens of thousand lux must be detected to control the back light.

However, since a high-illuminance photodiode which can detect an illuminance up to several tens of thousand lux has low sensitivity, the photodiode cannot be detect low-illuminance light. On the other hand, since a low-illuminance photodiode which can detect an illuminance up to 100 lux has high sensitivity, the photodiode is saturated by high-illuminance light. For example, an illuminance sensor used for control of some light emitting diodes of the key unit of a mobile phone cannot control the back light of a liquid crystal screen. Furthermore, an illuminance sensor used for control of the back light of a liquid crystal screen cannot control light emitting diodes of a key unit.

SUMMARY OF THE INVENTION

A semiconductor photosensor device according to an embodiment of the present invention comprises a plurality of photodiode sections having different illuminance-output characteristics; a switch which selects any one of the plurality of photodiodes on the basis of an illuminance of incident light irradiated on the photodiode sections; and an output section which outputs an output signal from the selected photodiode section through the switch.

A information apparatus incorporating a semiconductor photosensor device according to an embodiment of the present invention comprises a plurality of photodiode sections having different illuminance-output characteristics; a switch which selects any one of the plurality of photodiodes on the basis of an illuminance of incident light irradiated on the photodiode sections; and an output section which outputs an output signal from the selected photodiode section through the switch.

A semiconductor photosensor device according to an embodiment of the present invention comprises a photodiode section; an amplifier circuit having a variable gain and amplifying a output signal from the photodiode section and outputting the amplified signal; and a controller controlling the gain of the amplifier circuit on the basis of an illuminance of incident light irradiated on the photodiode section.

DETAILED DESCRIPTION OF THE INVENTION

Embodiments of the present invention will be described below with reference to the accompanying drawings.

(First Embodiment)

A first embodiment will be described below with reference to FIGS. 1 to 5.

Figure 1:
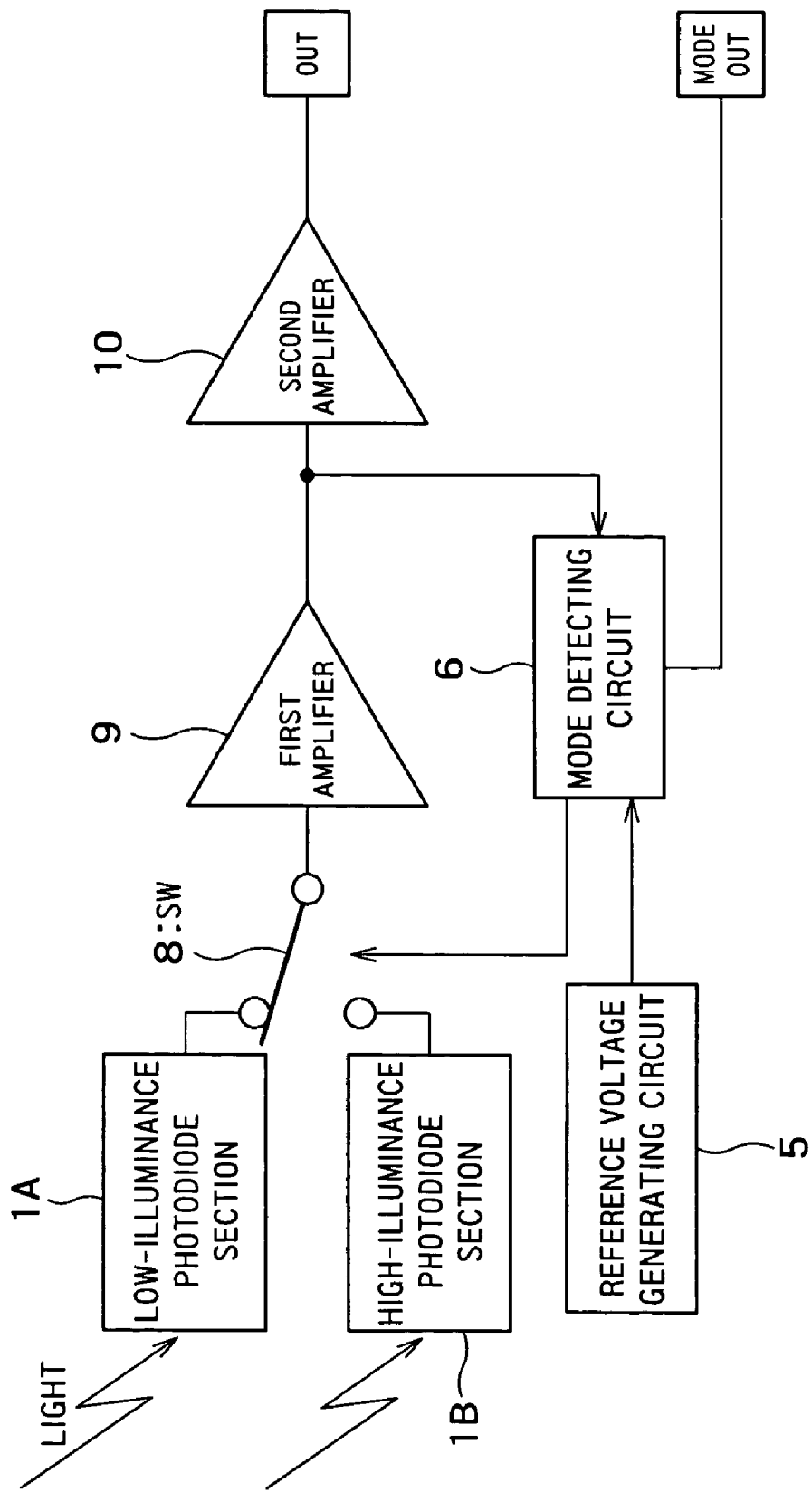
FIG. 1 is a circuit block diagram of an illuminance sensor according to the first embodiment.
Figure 2A:
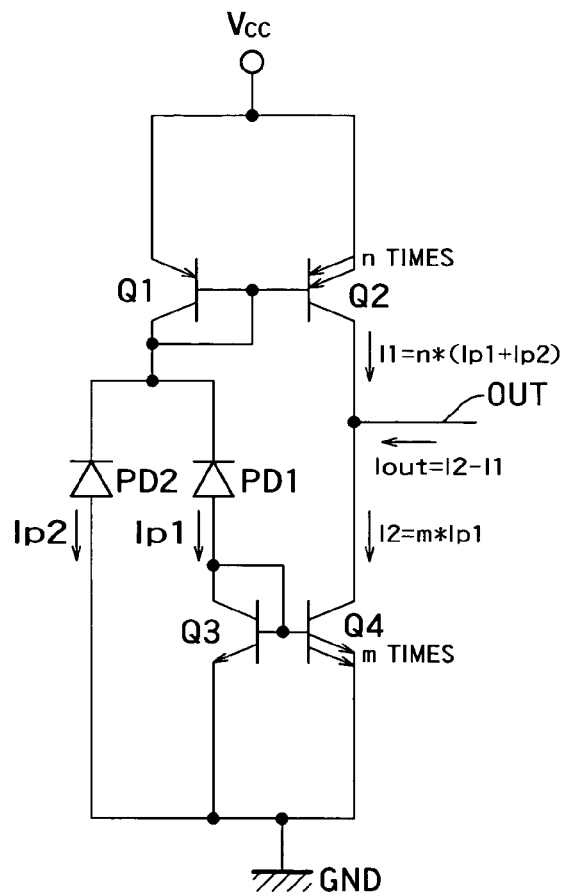
FIG. 2A is a circuit diagram showing an example of a photodiode section according to the first embodiment.
Figure 2B:
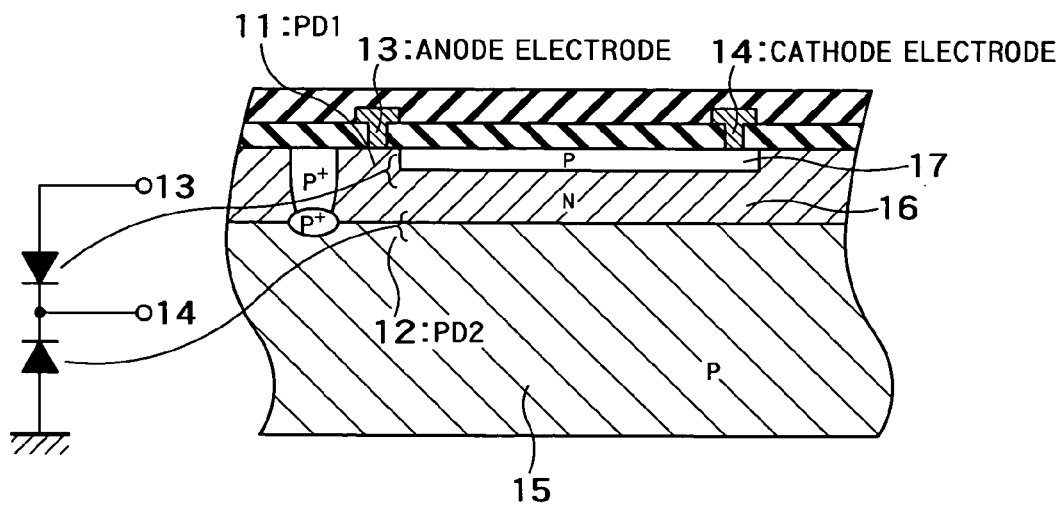
FIG. 2B is a partially cutaway view showing the structure of the photodiode section shown in FIG. 2A.
Figure 3A:
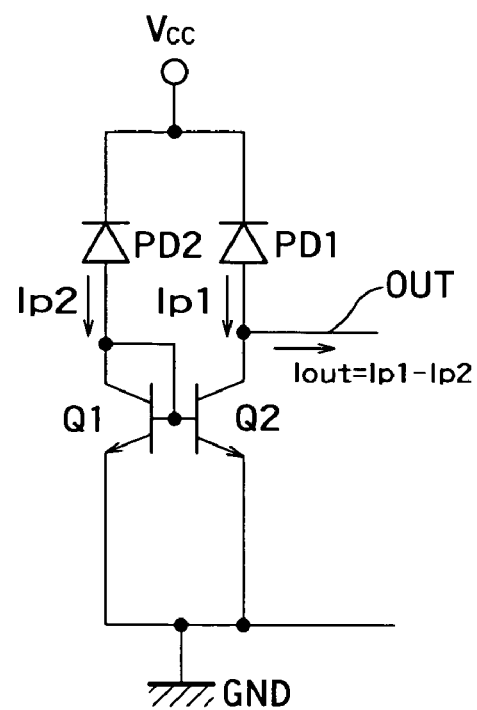
FIG. 3A is a circuit diagram of a modification of the photodiode section according to the first embodiment.
Figure 3B:
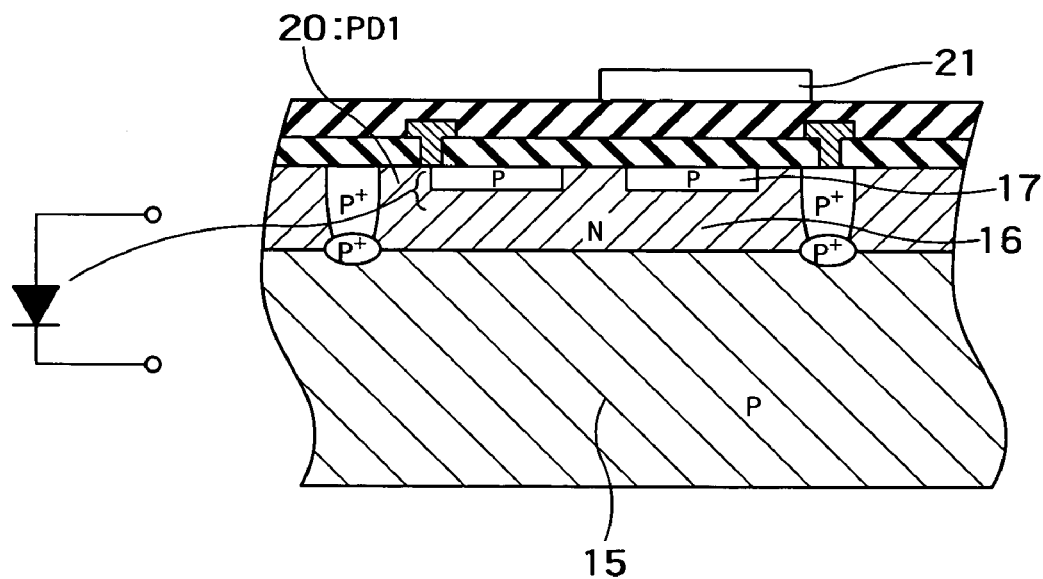
FIG. 3B is a partially sectional view showing the structure of the photodiode section shown in FIG. 3A.
Figure 4A:
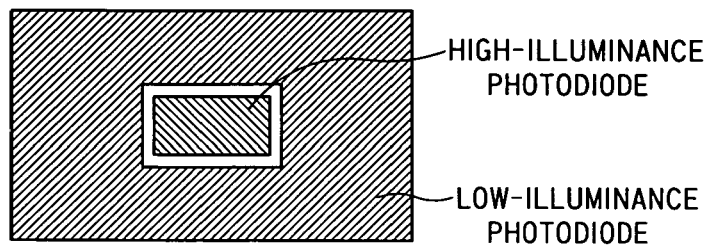
FIGS. 4A to 4C are schematic plan views of photodiodes showing a method of changing illuminance-output characteristics of photodiode (PD) sections.
Figure 4B:
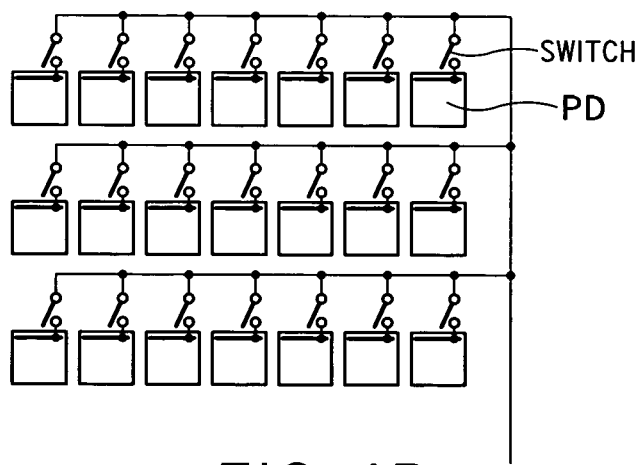
Figure 4C:
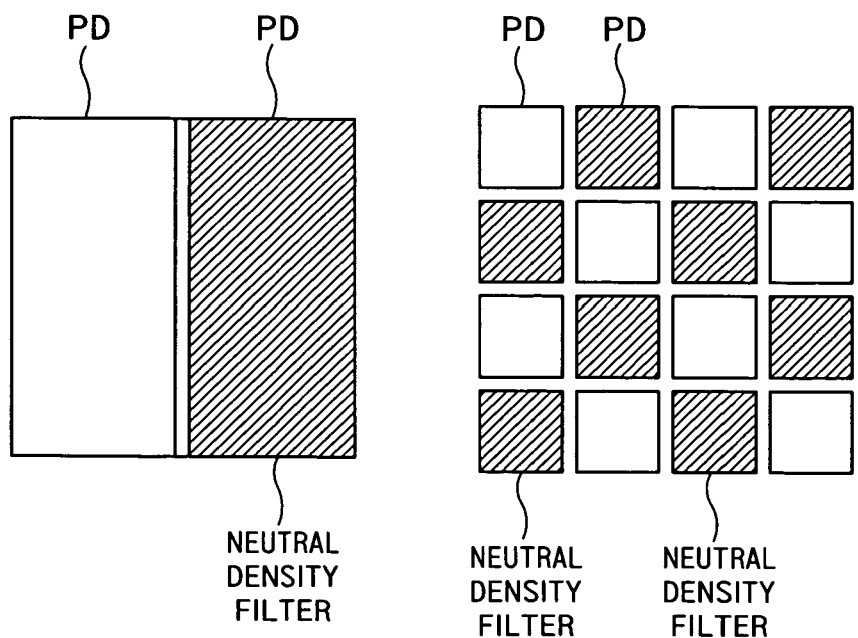
Figure 5A:
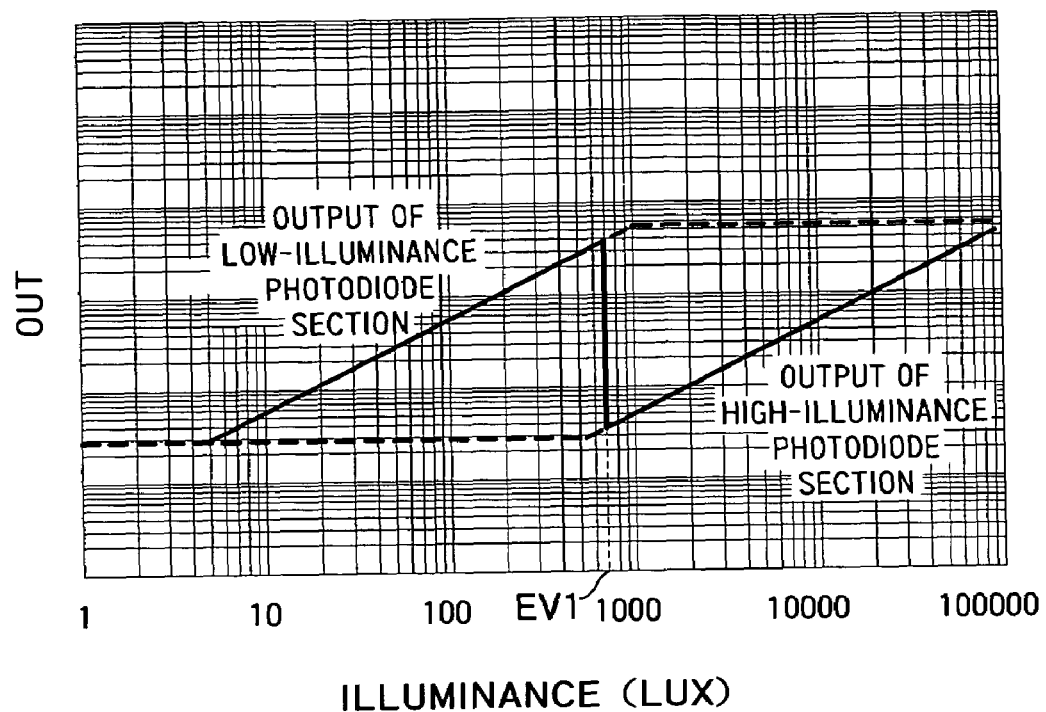
FIG. 5A is a graph showing an illuminance-output characteristic of an illuminance sensor.
Figure 5B:
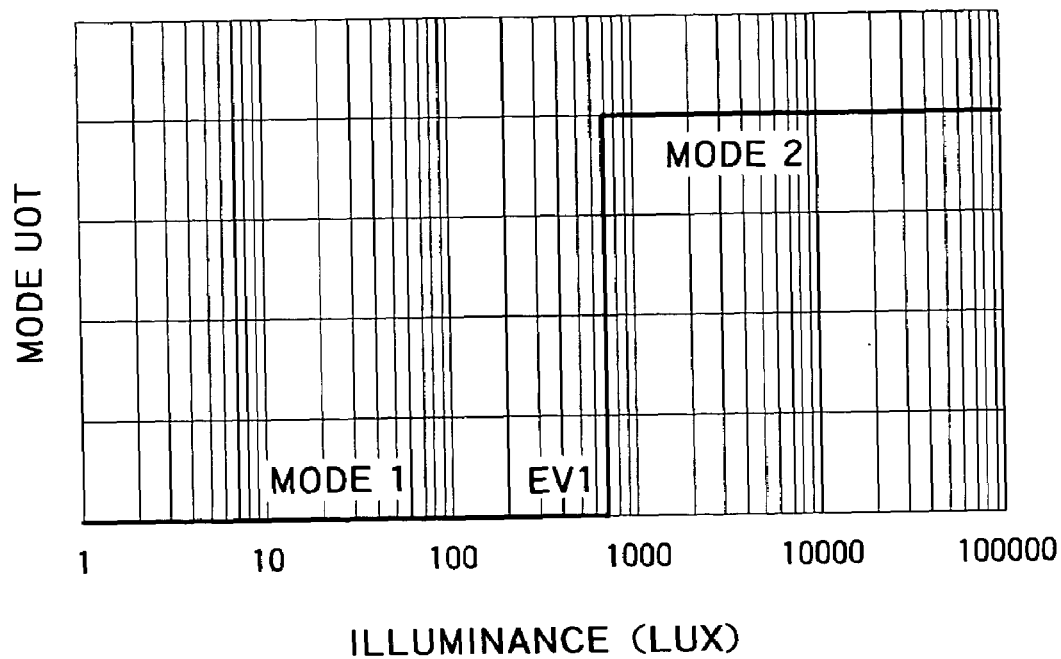
FIG. 5B is a graph showing an illuminance-mode output characteristic.

FIG. 1 is a circuit block diagram of an illuminance sensor according to the first embodiment, the illuminance sensor being formed on one semiconductor chip. FIG. 2A is a circuit diagram showing an example of a photodiode section according to the embodiment. Hereinafter, a photodiode and a peripheral circuit of the photodiode are referred to as a photodiode section. FIG. 2B is a partially cutaway view showing the structure of the photodiode section shown in FIG. 2A. FIG. 3A is a circuit diagram of a modification of the photodiode section according to the embodiment. FIG. 3B is a partially sectional view showing the structure of the photodiode PD1 and PD2 shown in FIG. 3A. FIGS. 4A to 4C are schematic plan views of photodiode sections showing a method of changing illuminance-output characteristics of photodiode (PD) sections. FIG. 5A is a graph showing an illuminance-output characteristic of an illuminance sensor. FIG. 5B is a graph showing an illuminance-mode output characteristic.

As shown in FIG. 1, an illuminance sensor includes a low-illuminance photodiode section (PD section) 1A and a high-illuminance photodiode section (PD section) 1B having different illuminance-output characteristics in a light-receiving section. A first amplifier 9 is connected to the output sides of the photodiode sections 1A and 1B. A switch (SW) 8 is inserted between the photodiode sections 1A, 1B and the first amplifier 9. The switch (SW) 8 selects any one of the low-illuminance photodiode section 1A and a high-illuminance photodiode section 1B to connect the selected photodiode section to the first amplifier 9.

The first amplifier 9 constituted by at least one amplifier is connected to a second amplifier 10 constituted by at least one amplifier. The second amplifier 10 is connected to an output section (OUT) of the illuminance sensor.

The illuminance sensor further includes a reference voltage generating circuit 5 and the mode detecting circuit 6. The mode detecting circuit 6 compares an output from the first amplifier 9 and an output from the reference voltage generating circuit 5 with each other to control the switch 8 on the basis of the comparison result. In this manner, the switch 8 can select any one of the photodiode sections 1A and 1B. The mode detecting circuit 6 includes a mode output section (mode OUT) which makes it possible to detect a state (mode) of the switch 8 from the outside. The mode OUT outputs mode information representing any one selected from the photodiode sections 1A and 1B by the switch 8. The second amplifier 10 is used as an output circuit.

The structures of the low-illuminance photodiode section 1A and the high-illuminance photodiode section 1B are shown in, e.g., FIGS. 2A and 2B or FIGS. 3A and 3B.

FIG. 2A is a circuit diagram showing a circuit configuration of a photodiode section. PNP transistors Q1 and Q2 constitute a current mirror to detect a sum of photoelectric currents of two photodiodes PD1 and PD2.

The base and the collector of the transistor Q1 are connected to a common cathode terminal A of the two photodiodes PD1 and PD2, and the emitter of the transistor Q1 is connected to a power supply terminal (Vcc).

The base of the output PNP transistor Q2 is connected to the base of the transistor Q1, the emitter of the transistor Q2 is connected to the power supply terminal (Vcc), and the collector of the transistor Q2 is connected to an output terminal (OUT).

NPN transistors Q3 and Q4 constitute a current mirror. The base and the collector of the transistor Q3 are connected to an anode terminal B, the emitter of the transistor Q3 is connected to a ground terminal (GND), the collector of the transistor Q3 is connected to the output terminal (OUT). An anode terminal C of the photodiode PD2 is grounded. A ratio of emitter areas of the transistors Q1 and Q2 and a ratio of emitter areas of the transistor Q3 and Q4 are optimally set depending on the illuminance-output characteristics of the two photodiodes PD1 and PD2 to obtain an output having desired sensitivity.

For example, it is assumed that the emitter area of the transistor Q2 is set to be n (n is a positive number) times the emitter area of the transistor Q1, and that the emitter area of the transistor Q4 is set to be m (m a positive number) times the emitter area of the transistor Q3. When light is incident on the light-receiving section in FIG. 2B, an output current IOUT is given by |I2−I1| where a collector current of the transistor Q2 and a collector current of the transistor Q4 are I1 and I2, respectively. The collector current I1 satisfies I1=n (Ip1+Ip2) with respect to photoelectric currents Ip1 and Ip2 of the two photodiodes PD1 and PD2. The collector current I2 of the transistor Q4 is given by I2=m*Ip1. Therefore, the output current IOUT is given by IOUT=m*Ip1−n*(Ip1+Ip2) =(m−n)*[Ip−{n/(m−n)}Ip2].

As shown in FIG. 2B, the photodiode PD2 is provided at deeper position in the substrate than the photodiode PD1. A short-wavelength light is absorbed at proximity of the surface of the substrate, on the contrary, a long-wavelength light can reach to a deep portion of the substrate. Therefore, the photodiode PD1 has a peak sensitivity for the short-wavelength light (a visible light), and the photodiode PD2 has a peak sensitivity for the long-wavelength light (an infrared light). As a result, the formula of the output current IOUT indicates an output current of the visible light, from which the infrared component is excluded. That is, this illuminance sensor detects an illuminance without an unnecessary infrared component.

The photodiode sections 1A and 1B includes the photodiodes PD1 and PD2 shown in FIG. 1A as main components. The photodiodes PD1 and PD2, as shown in FIG. 2b, are vertically formed in an element forming region of a semiconductor substrate consisting of silicon or the like and share a cathode electrode.

FIG. 2B is a partially cutaway view of a silicon semiconductor substrate in which photodiode PD1 and PD2. The semiconductor substrate is constituted by a p-type semiconductor substrate 15 and an n-type epitaxial layer 16 formed thereon. A p-type impurity diffusion region 17 is formed in the surface region of the n-type epitaxial layer 16. An anode electrode 13 is formed on the surface of the n-type epitaxial layer 16, and a cathode electrode 14 is formed on the surface of the p-type impurity diffusion region 17. The photodiode PD1 in FIG. 2a is constituted by the n-type epitaxial layer 16 and the p-type impurity diffusion region 17. The photodiode PD2 is constituted by the p-type semiconductor substrate 15 and the n-type epitaxial layer 16. The anode electrode 13 is connected to the photodiode PD1, and the cathode electrode 14 is shared by the photodiodes PD1 and PD2.

FIG. 3A is a circuit diagram showing another circuit configuration of the photodiode section 1A or 1B. The collector of the transistor Q2 is connected to the anode terminal of the photodiode PD1, the emitter of the transistor Q2 is connected to the ground terminal (GND), and the collector of the transistor Q2 is connected to the output terminal (OUT).

The transistors Q1 and Q2 constitute a current mirror. The base and the collector transistor Q1 are connected to the anode terminal of the photodiode PD2, and the emitter of the transistor Q1 is connected to the ground terminal (GND). When light is incident on the light-receiving section in FIG. 3B, the output current IOUT is a difference between photoelectric currents Ip1 and Ip2 of the two photodiodes PD1 and PD2, i.e., IOUT=Ip1−Ip2. This illuminance sensor detects an illuminance such that an unnecessary infrared component is removed by the photodiode PD2.

The configuration of the photodiode PD1 shown in the circuit diagram in FIG. 3A is shown in FIG. 3B. The semiconductor substrate is constituted by the p-type semiconductor substrate 15 and the n-type epitaxial layer 16 formed thereon. The p-type impurity diffusion region 17 is formed in the surface region of the n-type epitaxial layer 16. The photodiode PD2 in FIG. 3A is constituted by the n-type epitaxial layer 16 and the p-type impurity diffusion region 17. In a part of the p-type impurity diffusion region 17, a visible light region cut filter 21 is provided. The photodiode PD2 can detect only an infrared component of the light by the visible light region cut filter 21.

As a method of forming a low-illuminance photodiode section 1A and a high-illuminance photodiode section 1B in the embodiment, a method of changing an element forming size (light-receiving area) of a photodiode, a method of changing a light-receiving area by using a light-shielding plate such as a wiring electrode layer or the like are used.

FIG. 4A shows an embodiment in which the illuminance-output characteristics of photodiode sections 1A and 2B is changed in dependence upon a light-receiving area. The high-illuminance photodiode section 1B has an area smaller than that of the low-illuminance photodiode section 1A.

When a high illuminance is detected, a low-sensitive element is used as an illuminance sensor because an amount of received light is large. On the other hand, when a low illuminance is detected, a high-sensitive element is used as an illuminance sensor because an amount of received light is small. Since the amount of received light is in proportion to the area, the area of the photodiode provided in the high-illuminance photodiode section 1B (hereinafter, a photodiode provided in the high-illuminance photodiode section 1B is referred to a high-illuminance photodiode) is reduced, and the area of the photodiode provided in the low-illuminance photodiode section 1A (hereinafter, a photodiode provided in the low-illuminance photodiode section 1A is referred to a low-illuminance photodiode) is increased. In FIG. 4A, the high-illuminance photodiode and the low-illuminance photodiode are closely arranged. This arrangement is to make a light-receiving environment uniform as much as possible. More specifically, light-receiving characteristics of a peripheral portion and a central portion on the same semiconductor chip may be different from each other. The high-illuminance photodiode and the low-illuminance photodiode are closely arranged to avoid the change in light-receiving characteristics depending on places. The shape of the photodiode is rectangular in FIG. 4A. The shape is not limited to the rectangular shape, and a circular shape may be used. A ratio of the areas of the high-illuminance photodiode and the low-illuminance photodiode can be appropriately changed depending on applications.

FIG. 4B shows an embodiment in which a plurality of photodiodes having the same area and the same light-receiving characteristics are arranged to switch the number of photodiodes depending on the illuminance of incident light. A switch is fixed to each photodiode (PD). In order to obtain a predetermined illuminance-output characteristic, the switch is turned on/off. In this manner, the light-receiving area of the photodiode can be changed. When the photodiode is used as the low-illuminance photodiode, a relatively large number of switches are turned on to increase the light-receiving area. On the other hand, when the photodiode is used as the high-illuminance photodiode, a relatively small number of switches are turned off to reduce the light-receiving area.

A ratio of the light-receiving areas of the high-illuminance photodiode and the low-illuminance photodiode, which is shown in FIG. 4, can be appropriately changed by a switching operation depending on applications even after the photodiodes are manufactured.

FIG. 4C shows an embodiment in which a illuminance-output characteristic is changed by using a neutral density filter as the high-illuminance photodiode. The high-illuminance photodiode and the low-illuminance photodiode are constituted by the elements having the same areas and the same structures.

In the embodiment in FIGS. 4A and 4B, the high-illuminance photodiode and the low-illuminance photodiode are implemented by changing light-receiving areas. In the embodiment in FIG. 4C, photodiodes having equal characteristics are used, and a neutral density filter which degrades the light-receiving performance is arranged in the high-illuminance photodiode. In this manner, the illuminance-output characteristics of the high-illuminance photodiode and the low-illuminance photodiode are changed to make it possible to divide the applications.

In FIG. 4C, as in FIG. 4A, in order to make a light-receiving environment uniform as much as possible, the high-illuminance photodiode and the low-illuminance photodiode are closely arranged.

The operations of the illuminance sensor will be described below with reference to FIGS. 5A and 5B.

In FIG. 5A, the abscissa indicates an illuminance of light input to the illuminance sensor, and the ordinate indicates an output from the illuminance sensor. In FIG. 5B, the abscissa indicates the illuminance, and the ordinate indicates a mode output from a mode detecting circuit.

In the embodiment, the low-illuminance photodiode section 1A has a linear illuminance-output characteristic in a low-illuminance region ranging from several lux to about 1000 lux. The high-illuminance photodiode section 1B has a linear illuminance-output characteristic in a high-illuminance region ranging from about 1000 lux to several tens of thousand lux. An output from the photodiode is saturated with respect to an illuminance in a region except for a region having a linear illuminance-output characteristic. Therefore, the photodiode is not suitable for detecting an illuminance in a region except for the region having the linear illuminance-output characteristic. In the embodiment, the low-illuminance photodiode section 1A and the high-illuminance photodiode section 1B are switched on the basis of the illuminance of incident light.

In the initial state, the switch (SW) 8 selects a low-illuminance photodiode section 1A (state shown in FIG. 1). In this state, when light of a certain illuminance is incident on the illuminance sensor, the illuminance of the incident light is detected by the low-illuminance photodiode section 1A and the first amplifier 9. An output voltage outputted from the low-illuminance photodiode section 1A and amplified by the first amplifier 9 is compared with a first reference voltage (first threshold illuminance EV1) of the reference voltage generating circuit 5 by the mode detecting circuit 6. The first reference voltage corresponds to an output voltage from the first amplifier 9 when the light is irradiated on the low-illuminance photodiode section 1A with the first threshold illuminance EV1.

At this time, the illuminance of the light being incident on the photodiode section is lower than the first threshold illuminance EV1, i.e., when an input voltage (output voltage of the first amplifier 9) of the mode detecting circuit 6 is lower than the first reference voltage, the switch 8 keeps the state in which the low-illuminance photodiode section 1A is connected to the first amplifier 9. In this manner, the output section (OUT) outputs an output signal from the low-illuminance photodiode section 1A.

When the light being incident on the photodiode section is higher than the first threshold illuminance EV1, i.e., when the input voltage (output voltage of the first amplifier 9) of the mode detecting circuit 6 is higher than the first reference voltage, the switch 8 is switched to connect the low-illuminance photodiode section 1B to the first amplifier 9. In this manner, the output section (OUT) outputs an output signal from the high-illuminance photodiode section 1B.

More specifically, when the illuminance of the incident light is lower than the first threshold illuminance EV1, an output from the mode detecting circuit 6 is set as mode 1 (output 0). At this time, the switch 8 selects the low-illuminance photodiode section 1A. When the illuminance of the incident light is higher than the first threshold illuminance EV1, the output is set as mode 2, and the switch 8 selects the high-illuminance photodiode section 1B. In FIG. 5, the first threshold illuminance is lower than 1000 lux in some degree. However, this value is only an example. The first threshold illuminance can be set to be an arbitrary value depending on the types of apparatuses using the illuminance sensor.

Figure 5C:
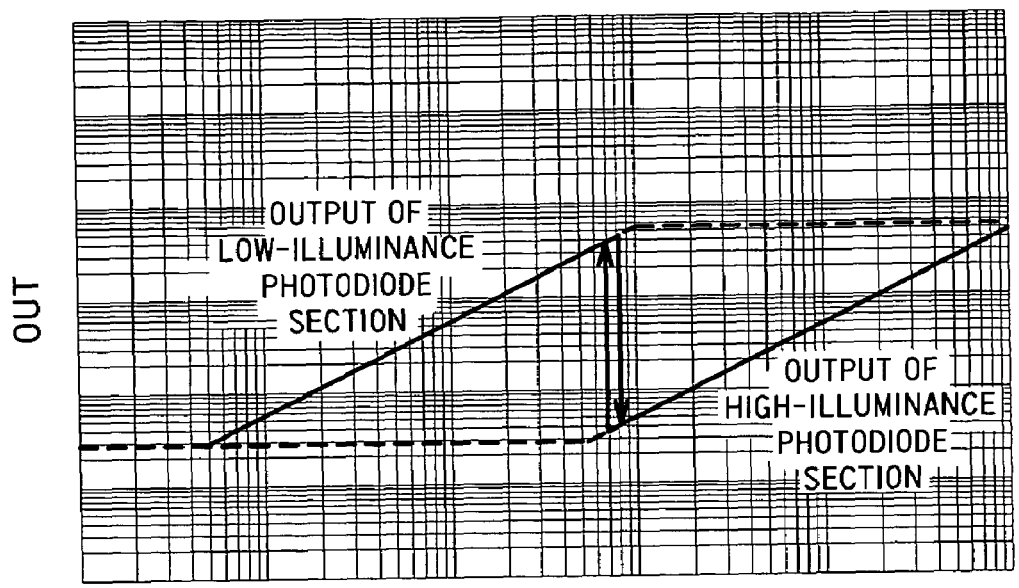
FIGS. 5C and 5D are graphs showing an illuminance-output characteristic provided with a hysteresis when switching between the high-illuminance photodiode section and the low-illuminance photodiode section.
Figure 5D:
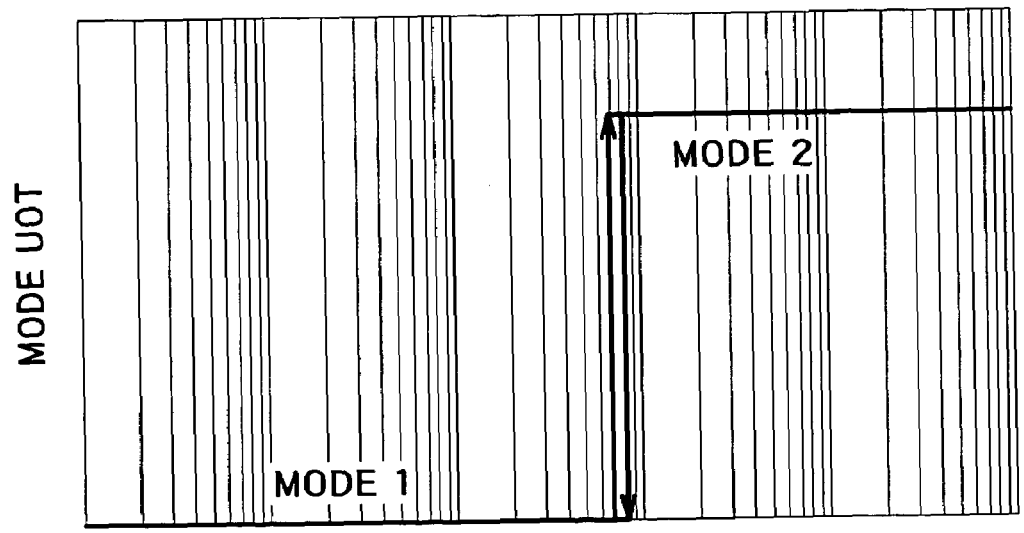

FIGS. 5C and 5D are graphs showing an illuminance-output characteristic provided with a hysteresis when switching between the high-illuminance photodiode section 1A and the low-illuminance photodiode section 1B. In FIGS. 5C and 5D, the abscissa indicates an illuminance of light input to the illuminance sensor, and the ordinate indicates an output from the illuminance sensor.

As shown in FIGS. 5C and 5D, a second threshold illuminance is further set in consideration of hysteresis. The first threshold illuminance EV1 is used to switch the switch from the high-illuminance photodiode section 1B to the low-illuminance photodiode section 1A, and a second threshold illuminance EV2 different from the first threshold illuminance EV1 may be used to switch the switch from the low-illuminance photodiode section 1A to the high-illuminance photodiode section 1B. More specifically, in switching from the high-illuminance photodiode section 1B to the low-illuminance photodiode section 1A and in switching from the low-illuminance photodiode section 1A to the high-illuminance photodiode section 1B, switching illuminances may be changed.

According to the embodiment, the low-illuminance and high-illuminance photodiode sections 1A and 2B are independently arranged, the low-illuminance photodiode section 1A and the high-illuminance photodiode section 1B can be used while being switched. Therefore, the embodiment can realize an accurate linear output in a wide range of a low illuminance, i.e., several lux to a high illuminance, i.e., several tens of thousand lux.

(Second Embodiment)

A second embodiment will be described below with reference to FIG. 6. The first embodiment includes the two photodiode sections selected by the switch. In contrast to this, the second embodiment includes n (three or more) photodiode sections PS1 to PSn.

Figure 6:
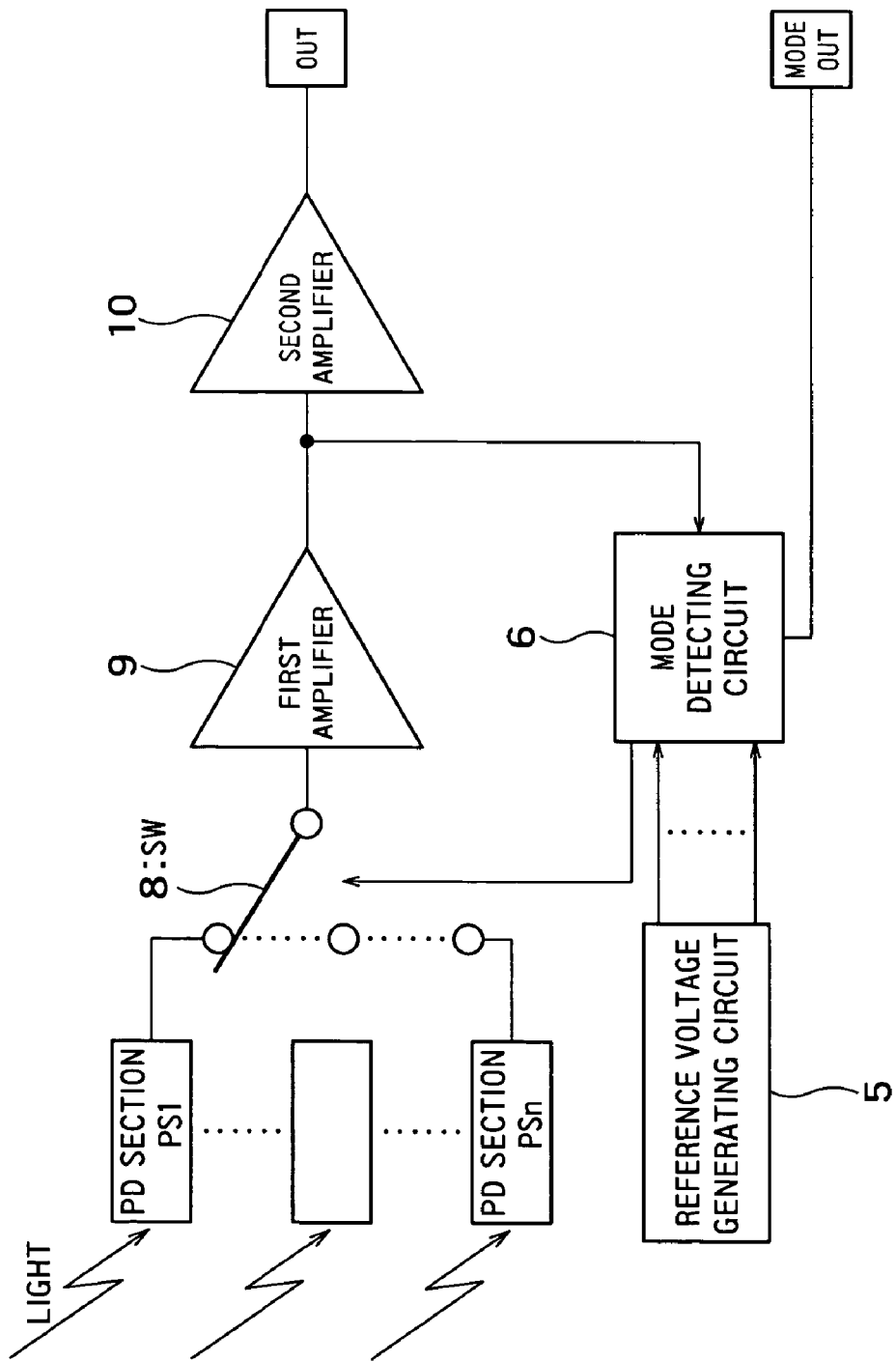
FIG. 6 is a circuit block diagram of an illuminance sensor according to the second embodiment.

FIG. 6 is a circuit block diagram of an illuminance sensor according to the second embodiment, the illuminance sensor being formed on one semiconductor chip. As shown in FIG. 6, the illuminance sensor includes a plurality of photodiode sections PS1 to PSn having the same spectral sensitivity characteristics and different illuminance-output characteristics and formed in a light-receiving section. Reference numeral PS1 denotes a low-illuminance photodiode section, and reference numerals PS2 to PSn sequentially denote photodiode section suitable for high illuminances. More specifically, the photodiode PD1 has a illuminance-output characteristic which is linear at a low illuminance, and the photodiode PD2 to PDn have illuminance-output characteristics which are linear at high illuminances gradually increasing.

A first amplifier 9 is connected to the output side of the photodiode sections PS2 to PSn. A switch (SW) 8 is inserted between the photodiode sections PS2 to PSn and the first amplifier 9. The switch (SW) 8 selects a predetermined photodiode section from the plurality of photodiode sections PS2 to PSn to connect the selected photodiode section to the first amplifier 9.

The first amplifier 9 is connected to a second amplifier 10, and the second amplifier 10 is connected to an output section (OUT) of the illuminance sensor.

The illuminance sensor further includes the reference voltage generating circuit 5 and the mode detecting circuit 6. The mode detecting circuit 6 compares an output from the first amplifier 9 with an output from the reference voltage generating circuit 5 to control the switch 8 on the basis of the comparison result. In this manner, the switch 8 can select any one of the photodiode sections PS2 to PSn. In this case, reference numeral "n" denotes a natural number. The mode detecting circuit 6 includes a mode output section (mode OUT) to make it possible to detect a state (mode) of the switch 8 from the outside. The mode OUT outputs mode information representing any one of photodiode sections PS2 to PSn selected by the switch 8.

In the initial state, the switch (SW) 8, for example, selects a low-illuminance photodiode section such as a photodiode section (PSl) (state shown in FIG. 6). In this state, when light of a certain illuminance is irradiated on the illuminance sensor, the illuminance is detected by the photodiode section PS1 and the first amplifier 9. An output voltage of the low-illuminance photodiode section PS1 amplified by the first amplifier 9 is compared with a first reference voltage of the reference voltage generating circuit 5 by the mode detecting circuit 6.

At this time, when the illuminance of the light being incident on the photodiode section PS1 is lower than a first threshold illuminance, i.e., an input voltage (output voltage of the first amplifier 9) of the mode detecting circuit 6 is lower than a first reference voltage, the switch 8 keeps a state in which the photodiode section PS1 is connected to the first amplifier 9. In this manner, the output section (OUT) outputs an output signal from the low-illuminance photodiode section PS1.

When the input voltage (output voltage of the first amplifier 9) of the mode detecting circuit 6 is higher than the first reference voltage, the switch 8 is switched to connect a photodiode section PSi (i=2 to n) for an illuminance higher than that of the photodiode section PS1 to the first amplifier 9. In this manner, the output section (OUT) outputs an output signal from the photodiode section PSi.

When the illuminance of the incident light changes, the mode detecting circuit 6 compares the output voltage of the first amplifier 9 with any one of (n−1) reference voltages, and the switch 8 selects a photodiode section PSk (k=1 to n) suitable for the illuminance of the incident light.

In the first embodiment, one setting threshold value, i.e., a threshold value EV1 is set for the mode detecting circuit 6. When two setting threshold values are set, the setting threshold values can be effectively used by preparing three selective photodiode sections.

The second embodiment includes n selective photodiode sections. Therefore, the n photodiode sections can be effectively used by preparing (n−1) reference voltages. The structure of the photodiode section 1 is as shown in FIG. 2 or 3. The configurations of the photodiode sections PS1 to PSn in the embodiment are the same as those in the first embodiment.

According to the second embodiment, the photodiode sections having a plurality of illuminance-output characteristics different from each other are independently arranged, and the photodiode sections are switched. In this manner, an illuminance sensor having an accurate linear output in a range of a low illuminance, i.e., several lux to a high illuminance, i.e., several tens of thousand lux can be obtained.

In both the first and second embodiments, a mode is set for a low illuminance in the initial state. However, when light of a high illuminance is incident from the beginning of detection, a saturation value of a low-illuminance amplifier is output to the output section (OUT) of the illuminance sensor until a mode is set by the mode detecting circuit 6.

In order to cope with this, the output section (OUT) is fixed to a ground potential until mode setting is performed in the mode detecting circuit 6. After the mode setting is performed, a signal from a photodiode section may be output from the output section (OUT). In this manner, a saturation value can be prevented from being output from an amplifier.

In the first embodiment, the sensor having the two low-illuminance and high-illuminance detecting sections (photodiode sections in the embodiment) is explained. However, in the second embodiment, the photodiode sections having three or more different illuminance-output characteristics make it possible to perform detection of light in a range of a low illuminance to a high illuminance. In this case, a necessary number of potentials must be arranged in the reference voltage generating circuit 5. In this manner, for example, an illuminance sensor corresponding to an illuminance region of 10 lux or less or an illuminance region of 100000 lux or more can be realized.

(Third Embodiment)

A third embodiment will be described below with reference to FIGS. 7 to 8.

The first and second embodiments have photodiode sections constituted by two or more photodiodes selected by a switch. In contrast to this, as a characteristic feature, the third embodiment includes an amplifying section constituted by two amplifiers selected by a switch.

Figure 7A:
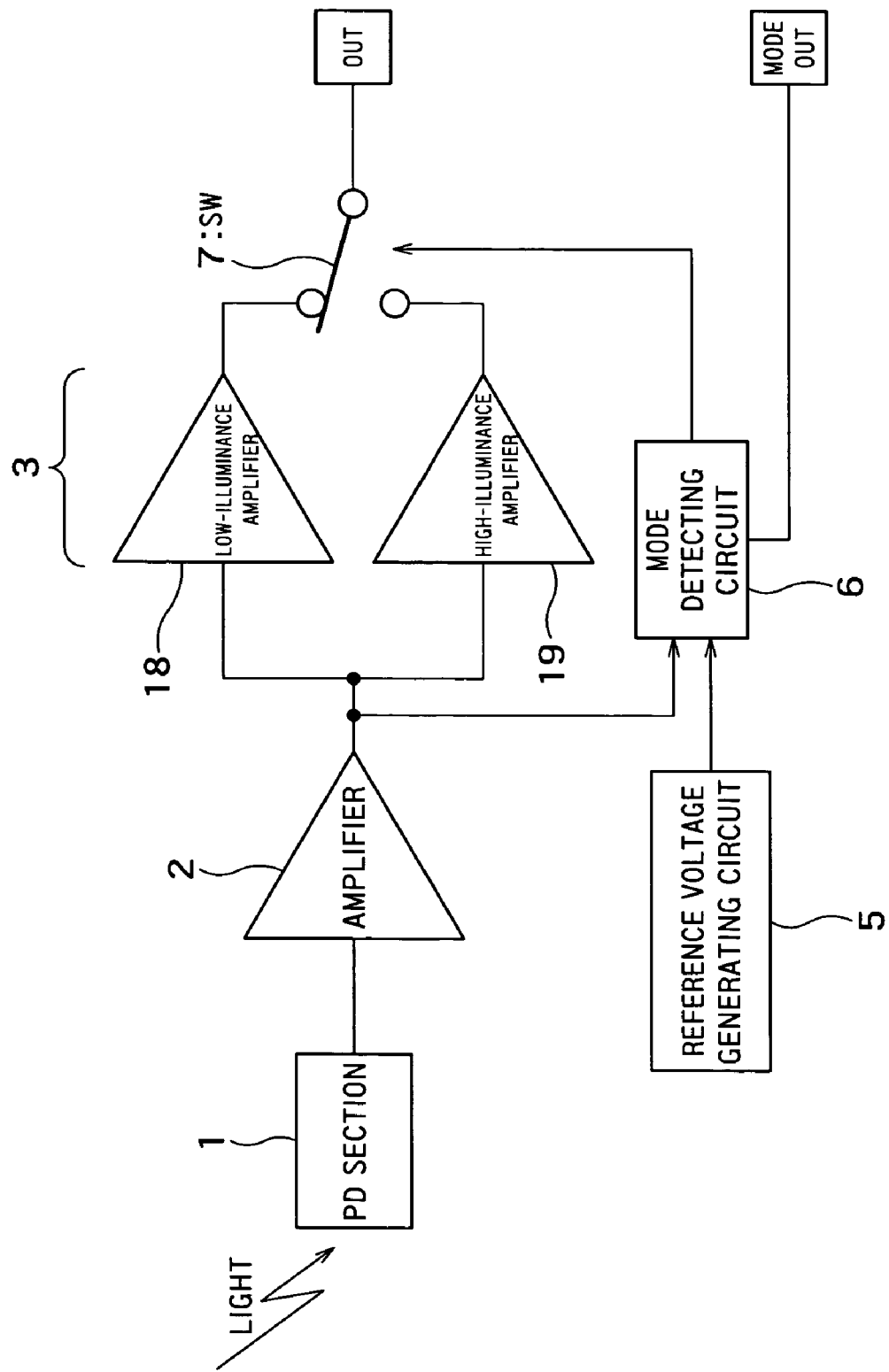
FIG. 7A is a circuit block diagram of an illuminance sensor according to the third embodiment.
Figure 8A:
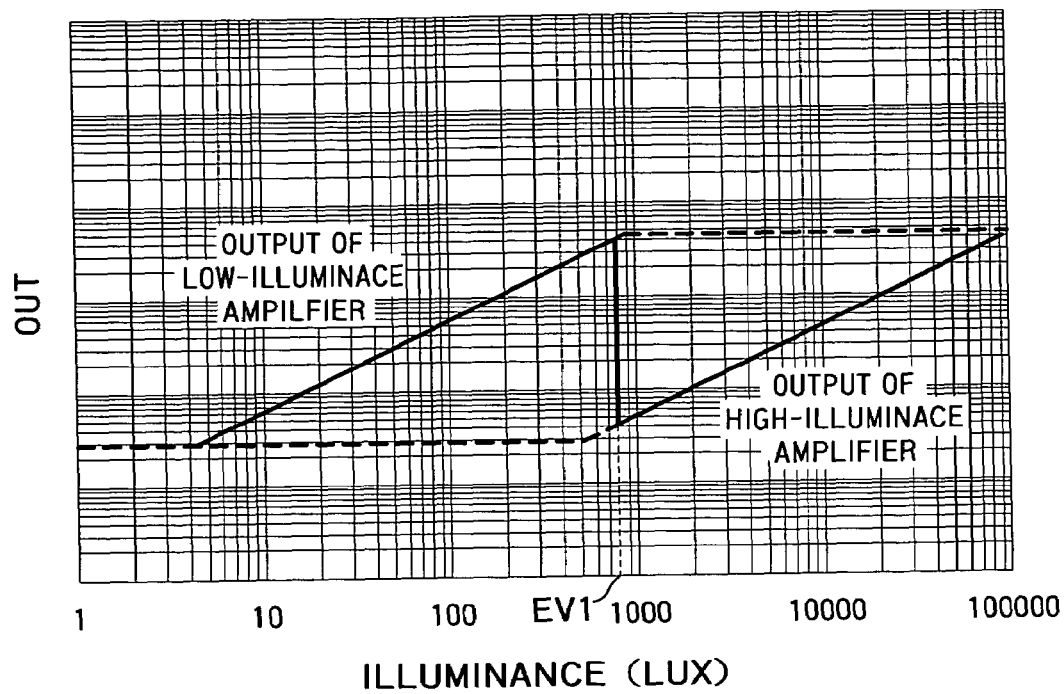
FIG. 8A is a graph showing an illuminance-output characteristic of the illuminance sensor according to the embodiment.
Figure 8B:
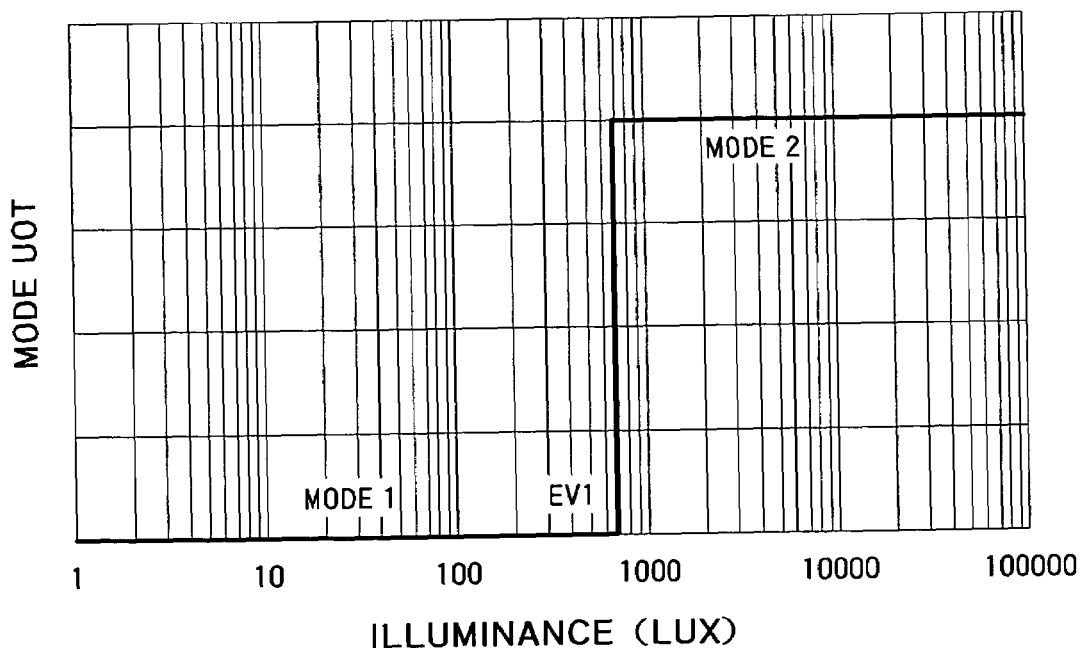
FIG. 8B is a graph showing an illuminance-mode output characteristic of the illuminance sensor according to the embodiment.

FIG. 7A is a circuit block diagram of an illuminance sensor according to the third embodiment, the illuminance sensor being formed on one semiconductor chip. FIGS. 8A and 8B are graphs showing an illuminance-output characteristic and an illuminance-mode output characteristic of the illuminance sensor according to the embodiment, respectively.

As shown in FIG. 7A, the illuminance sensor includes a photodiode section 1 in a light-receiving section. The photodiode section 1 may have the same characteristic as that in the first or second embodiment or may have a characteristic different from that in the first embodiment. The photodiode section 1 is not specified by a specific photodiode section. A first amplifier 2 is connected to the output side of the photodiode section. The first amplifier 2 is connected to a plurality of second amplifying sections 3 (18 and 19) having different characteristics such as gains (see FIG. 8A). The second amplifying sections 3 are output to an output section (OUT) of the illuminance sensor through a switch (SW) 7.

The configurations of a low-illuminance second amplifier (low-illuminance amplifier) 18 and a high-illuminance second amplifier (high-illuminance amplifier) 19 can be realized by amplifiers having the same circuit configurations and gains which are different from each other. The low-illuminance amplifier 18 has a linear illuminance-output characteristic in a range of several lux to several tens of thousand lux obtained by converting an input photoelectric current. The high-illuminance second amplifier 19 has a linear illuminance-output characteristic in a range of several hundred lux to several tens of hundred lux. Outputs of the amplifiers 18 and 19 are constant in a range except for the linear range with respect to inputs. A first threshold illuminance EV1 corresponding to the first reference voltage is set in an overlapping range between the range of the linear illuminance-output characteristic of the low-illuminance amplifier 18 and the range of the linear illuminance-output characteristic of the high-illuminance amplifier 19.

Figure 8C:
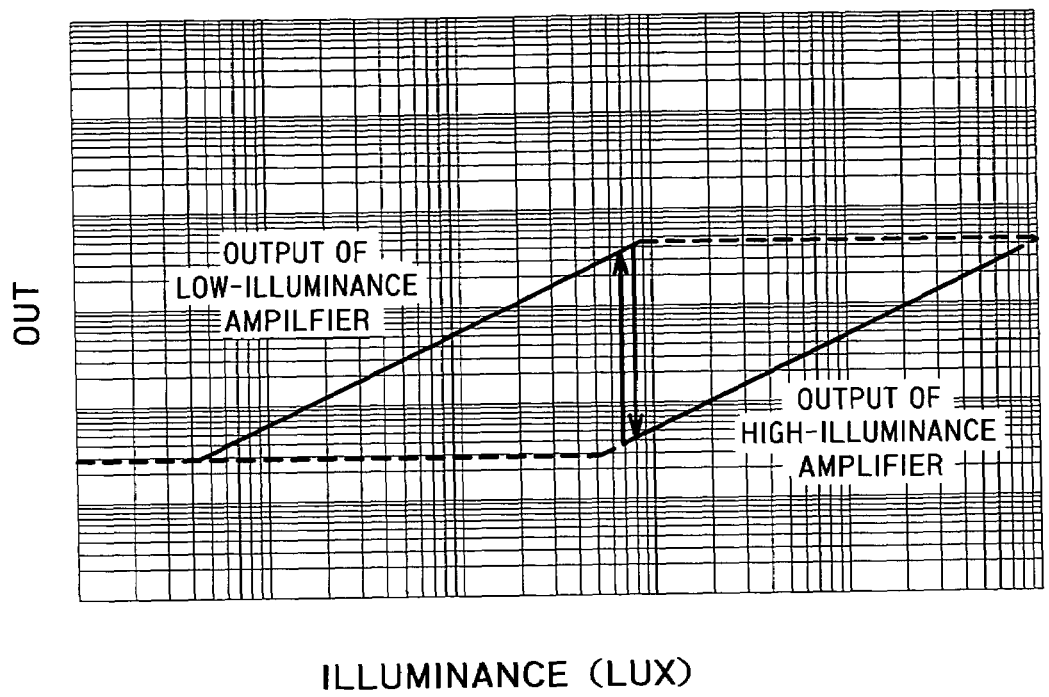
FIGS. 8C and 8D are graphs showing an illuminance-output characteristic provided with a hysteresis when switching between the high-illuminance photodiode section and the low-illuminance photodiode section.
Figure 8D:
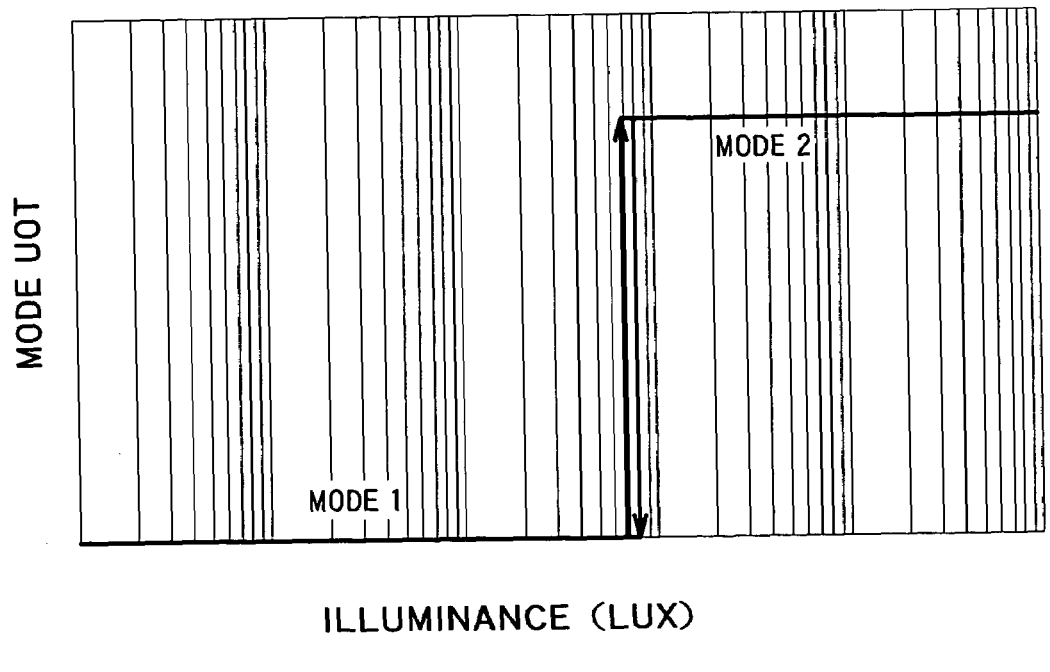

FIGS. 8C and 8D are graphs showing an illuminance-output characteristic provided with a hysteresis when switching between the high-illuminance photodiode section and the low-illuminance photodiode section. In FIGS. 8C and 8D, the abscissa indicates an illuminance of light input to the illuminance sensor, and the ordinate indicates an output from the illuminance sensor.

As shown in FIGS. 8C and 8D, a second threshold illuminance EV2 (second reference voltage) may be further set in consideration of hysteresis. The first threshold illuminance EV1 can be used to switch the switch 7 from the high-illuminance amplifier to the low-illuminance amplifier, and the second threshold illuminance EV2 can be used to switch the switch from the low-illuminance amplifier to the high-illuminance amplifier. More specifically, in switching from the high-illuminance amplifier to the low-illuminance amplifier and in switching from the low-illuminance amplifier to the high-illuminance amplifier, switching illuminances can be changed.

The configuration of the photodiode section 1 according to the third embodiment may be the same as that in the first embodiment.

The switch 7 selects any one of the low-illuminance amplifier 18 and the high-illuminance amplifier 19 constituting the plurality of second amplifying sections 3 such as amplifiers having different characteristics. The illuminance sensor further includes the reference voltage generating circuit 5 and the mode detecting circuit 6. The mode detecting circuit 6 compares an output from the first amplifier 2 with an output from the reference voltage generating circuit 5 to control the switch 7 on the basis of the comparison result. In this manner, the switch 7 can select any one of the amplifier 18 and the amplifier 19. The mode detecting circuit 6 includes a mode output section (mode OUT) to make it possible to detect a state (mode) of the switch 7 from the outside. The mode OUT outputs mode information representing any one of the amplifiers 18 and 19 selected by the switch 7.

An operation of the illuminance sensor will be described below with reference to FIGS. 8A and 8B.

In FIG. 8A, the abscissa indicates an illuminance of light input to the illuminance sensor, and the ordinate indicate an output from the illuminance sensor. In FIG. 8B, the abscissa indicates the illuminance, and the ordinate indicates a mode output from a mode detecting circuit.

In the initial state, the switch 7 selects the low-illuminance amplifier 18 (state shown in FIG. 7). In this state, when light of a certain illuminance is incident on the photodiode section 1, the incident light is amplified to an output depending on the illuminance by the first amplifier 2. An output from the first amplifier 2 is input to the low-illuminance amplifier 18, the high-illuminance amplifier 19, and then the mode detecting circuit 6. The mode detecting circuit 6 compares the output voltage with a first reference voltage set by the reference voltage generating circuit 5 to switch the switch 7. The first reference voltage is a voltage output from the first amplifier 2 by the first threshold illuminance EV1.

When the output voltage of the first amplifier 2 is lower than the first reference voltage, the switch 7 keeps connection between the output from the low-illuminance amplifier 18 and the output section (OUT). In this manner, the output section (OUT) outputs an output signal from the low-illuminance amplifier 18. When the output voltage of the first amplifier 2 is higher than the first reference voltage, the switch 7 connects the output from the high-illuminance amplifier 19 to the output section (OUT). In this manner, the output section (OUT) outputs an output signal from the high-illuminance amplifier 19.

The low-illuminance amplifier 18 has an input/output characteristic which is linear when a photoelectric current to incident light of an illuminance y ($c \leq y \leq EV1$) is input. The high-illuminance amplifier 19 has an input/output characteristic which is linear when a photoelectric current to incident light of an illuminance y ($EV1 < y \leq d$) is input. The switch which switches the low-illuminance amplifier 18 and the high-illuminance amplifier 19 may select the low-illuminance amplifier 18 when the illuminance y of incident light being incident on the photodiode section 1 satisfies $y \leq EV1$, and may select the high-illuminance amplifier 19 when the illuminance y of the incident light being incident on the photodiode section 1 satisfies $EV1 < y$.

A second reference voltage which is a voltage output from the first amplifier 2 by the second threshold illuminance EV2, may be further set in consideration of hysteresis. The first reference voltage can be used to switch the switch 7 from the high-illuminance amplifier 19 to the low-illuminance amplifier 18, and the second reference voltage can be used to switch the switch from the low-illuminance amplifier 18 to the high-illuminance amplifier 19. More specifically, in switching from the high-illuminance amplifier 19 to the low-illuminance amplifier 18 and in switching from the low-illuminance amplifier 18 to the high-illuminance amplifier 19, reference voltages can be changed.

According to the third embodiment, the low-illuminance amplifier 18 and the high-illuminance amplifier 19 are independently arranged and switched to each other. In this manner, in the third embodiment, an accurate linear output in an illuminance range of a low illuminance, i.e., several lux to a high illuminance, i.e., several tens of thousand lux.

Figure 7B:
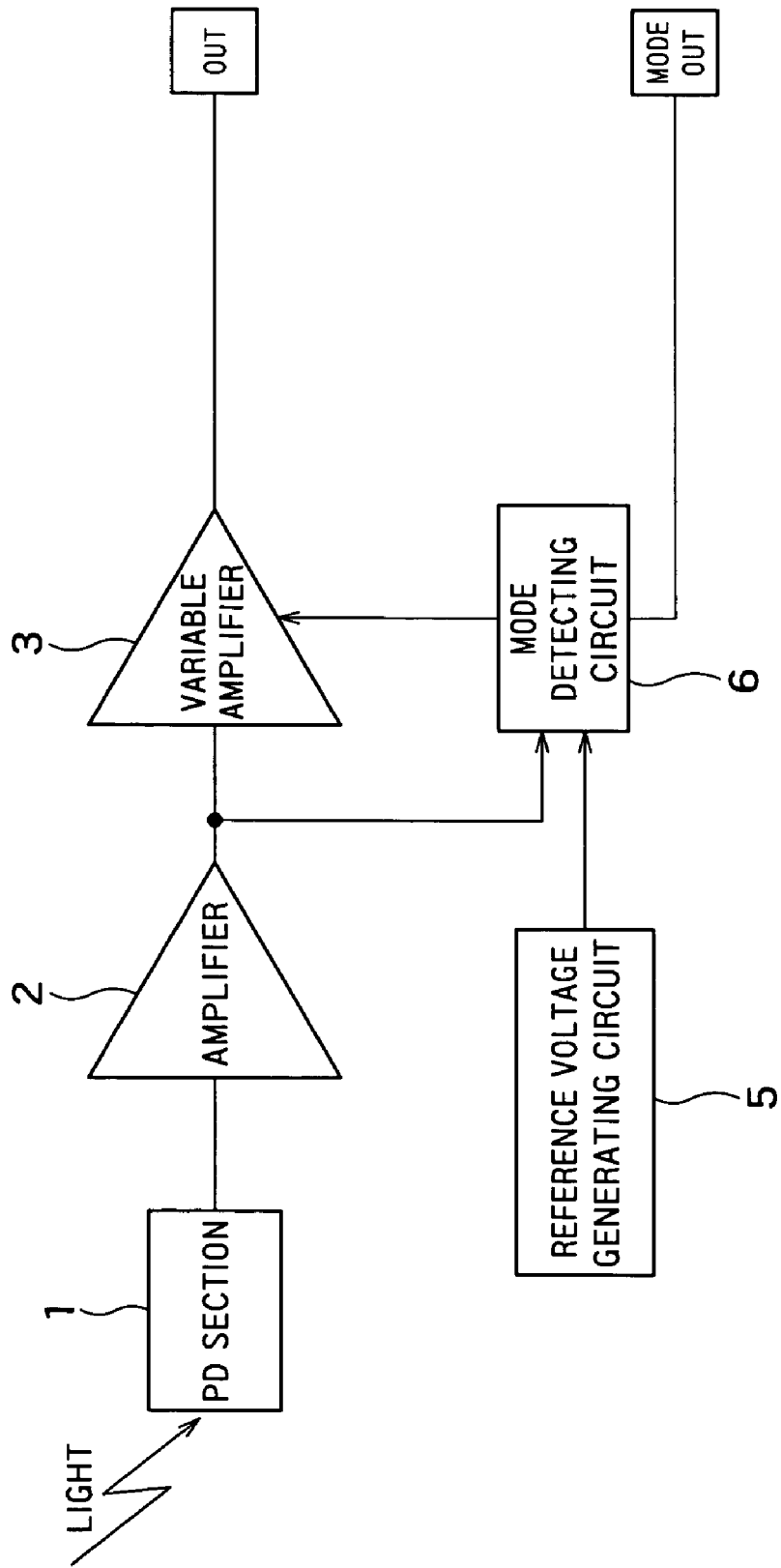
FIG. 7B is a block diagram of an illuminance sensor including one variable amplifier 3 in place of the low-illuminance amplifier 18 and the high-illuminance amplifier 19.

FIG. 7B is a block diagram of an illuminance sensor including one variable amplifier 3 in place of the low-illuminance amplifier 18 and the high-illuminance amplifier 19. The variable amplifier 3 receives a signal from the mode detecting circuit 6 to change the gain of the second amplifier 3. The configuration of the illuminance sensor shown in FIG. 7B is the same as that of the illuminance sensor shown in FIG. 7A.

For example, in application of the illuminance sensor shown in FIG. 7B to the example, when a signal corresponding to incident light of an illuminance y ($c \leq y \leq EV1$) is input, the variable amplifier 3 amplifies the signal by a relatively large gain. When a photoelectric current corresponding to incident light of an illuminance y ($EV1 < y \leq d$), the variable amplifier 3 amplifies the signal by a relatively small gain.

In this manner, the variable amplifier 3 switches gains on the basis of a signal from the mode detecting circuit 6. As a result, the illuminance sensor shown in FIG. 7B has the same effect as that of the illuminance sensor shown in FIG. 7A. In addition, the illuminance sensor shown in FIG. 7B has only one amplifier as the second amplifying section and does not need a switch. Therefore, the illuminance sensor shown in FIG. 7B can achieve a relatively small chip size.

(Fourth Embodiment)

A fourth embodiment will be described below with reference to FIG. 9.

The fourth embodiment has an amplifying section constituted by three or more amplifiers selected by a switch.

Figure 9A:
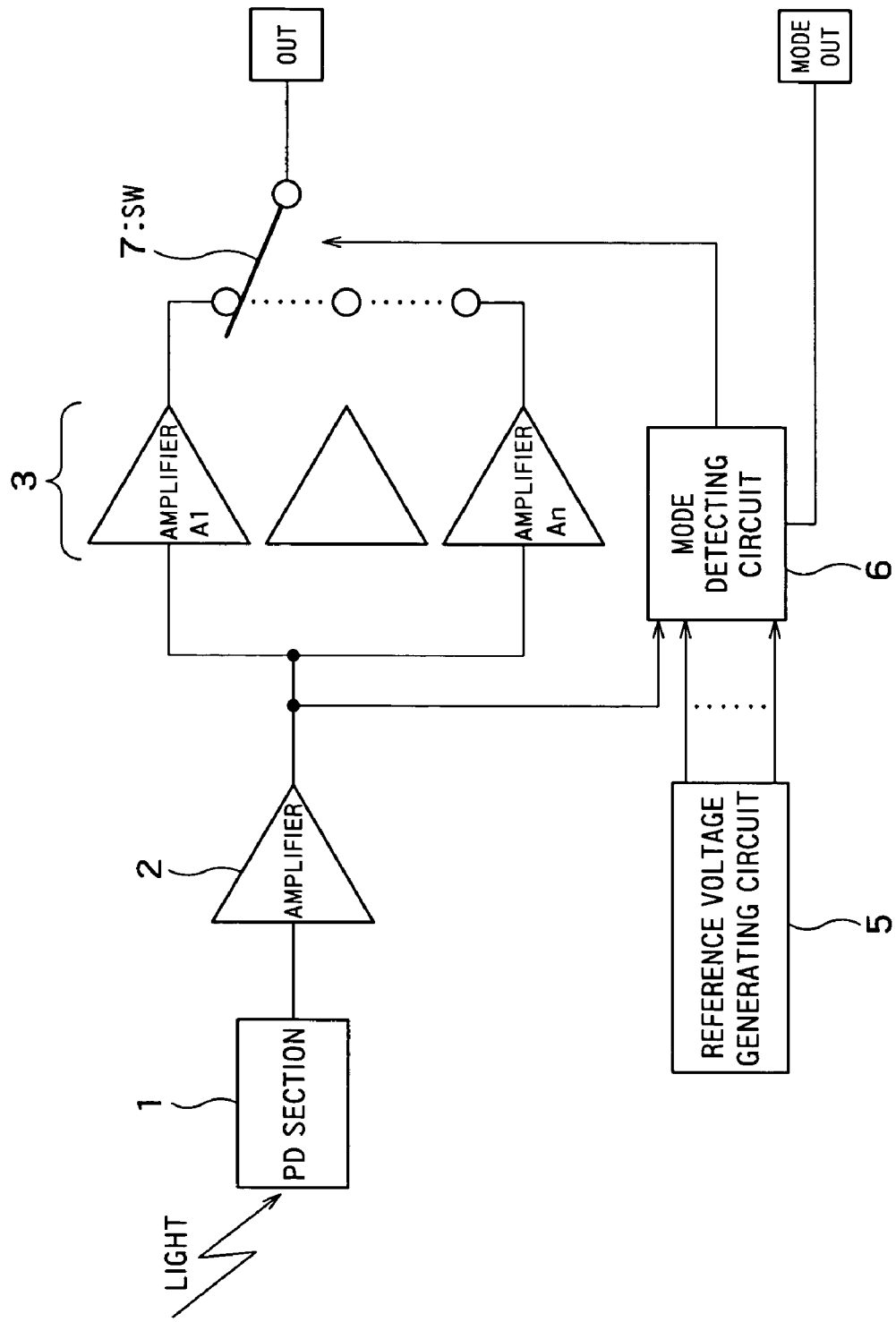
FIG. 9A is a circuit block diagram of an illuminance sensor according to the fourth embodiment.

FIG. 9A is a circuit block diagram of an illuminance sensor according to the fourth embodiment, the illuminance sensor being formed on one semiconductor chip. As shown in FIG. 9A, the illuminance sensor includes a plurality of second amplifying sections (amplifier 1, amplifier 2, . . . , amplifier n) 3 formed in a light-receiving section and having different characteristics such as amplification degrees. The structure of a photodiode section 1 is shown in, e.g., FIG. 2 or FIG. 3. The configuration of the photodiode section 1 in the embodiment may be the same as that in the first embodiment. A first amplifier 2 is connected to the output side of the photodiode section 1. The first amplifier 2 is connected to a second amplifier 3, and the second amplifier 3 is connected to an output section (OUT) through a switch (SW) 7. The photodiode section 1 used in the embodiment may have the same configuration as that of each of the first and second embodiments or may have a configuration different from that of each of the first and second embodiment. This illuminance sensor further includes the reference voltage generating circuit 5 and the mode detecting circuit 6. The mode detecting circuit 6 compares an output from the first amplifier 2 with an output from the reference voltage generating circuit 5 to control the switch 7 on the basis of the comparison result. In this manner, the switch 7 can select any one of second amplifiers A1 to An. The mode detecting circuit 6 includes a mode output section (mode OUT) to make it possible to detect a state (mode) of the switch 7 from the outside. The mode OUT outputs mode information representing any one of the amplifiers A1 to An selected by the switch 7.

In the initial state, the switch 7 selects the second amplifier A1 for a low illuminance (state shown in FIG. 9A). In this state, when light of a certain illuminance is incident on the illuminance sensor, the incident light is amplified to an output depending on the illuminance by the first amplifier 2. An output from the first amplifier 2 is input to the second amplifier 3 and the mode detecting circuit 6. The mode detecting circuit 6 compares the output voltage with first to (n–1) the reference voltages set by the reference voltage generating circuit 5 to switch the switch 7.

At this time, when the illuminance of the light being incident on the photodiode section is lower than a first threshold illuminance, i.e., an input voltage (output voltage of the first amplifier A1) of the mode detecting circuit 6 is lower than the first reference voltage, the switch 7 keeps a state in which the low-illuminance second amplifier A1 is connected to the first amplifier 2. In this manner, the output section (OUT) outputs an output signal from the second amplifier A1.

When the input voltage (output voltage of the first amplifier 2) of the mode detecting circuit 6 is higher than a first reference voltage EV1, i.e., the output voltage of the amplifier A1 is higher than the first reference voltage, a switch 8 connects a second amplifier Ai (i=2 to n) to the first amplifier 2. In this manner, the output section (OUT) outputs an output signal from the second amplifier Ai.

When the illuminance of the incident light further changes, the mode detecting circuit 6 compares the output voltage of the amplifier 9 with any one of the (n–1) reference voltages or all of them, and the switch 8 selects an amplifier Ak (k=1 to n) suitable for the illuminance of the incident light.

In the fourth embodiment, the (n–1) reference voltages (threshold illuminances) are set, the two amplifiers (second amplifiers) for selection are used. Therefore, the illuminance sensor according to the fourth embodiment can amplify a signal by different n-step different gains. More specifically, according to the fourth embodiment, the plurality of second amplifiers having different characteristics such as amplification degrees are independently arranged and switched to each other. In this manner, in the fourth embodiment, an illuminance sensor which is outputs an accurate output in an illuminance range of a low illuminance, i.e., several lux to a high illuminance, i.e., several tens of thousand lux.

In the fourth embodiment, the initial state, a mode is set for a low illuminance in the initial state. However, when light of a high illuminance is incident from the beginning of detection, a saturation value of a low-illuminance amplifier is output to the output section (OUT) of the illuminance sensor until a mode is set by the mode detecting circuit 6.

In order to cope with this, the output section (OUT) is fixed to a ground potential until mode setting is performed in the mode detecting circuit 6. After the mode setting is performed, an output signal is controlled to be output from the output section (OUT). In this manner, a saturation value can be prevented from being output from a low-illuminance amplifier.

Figure 9B:
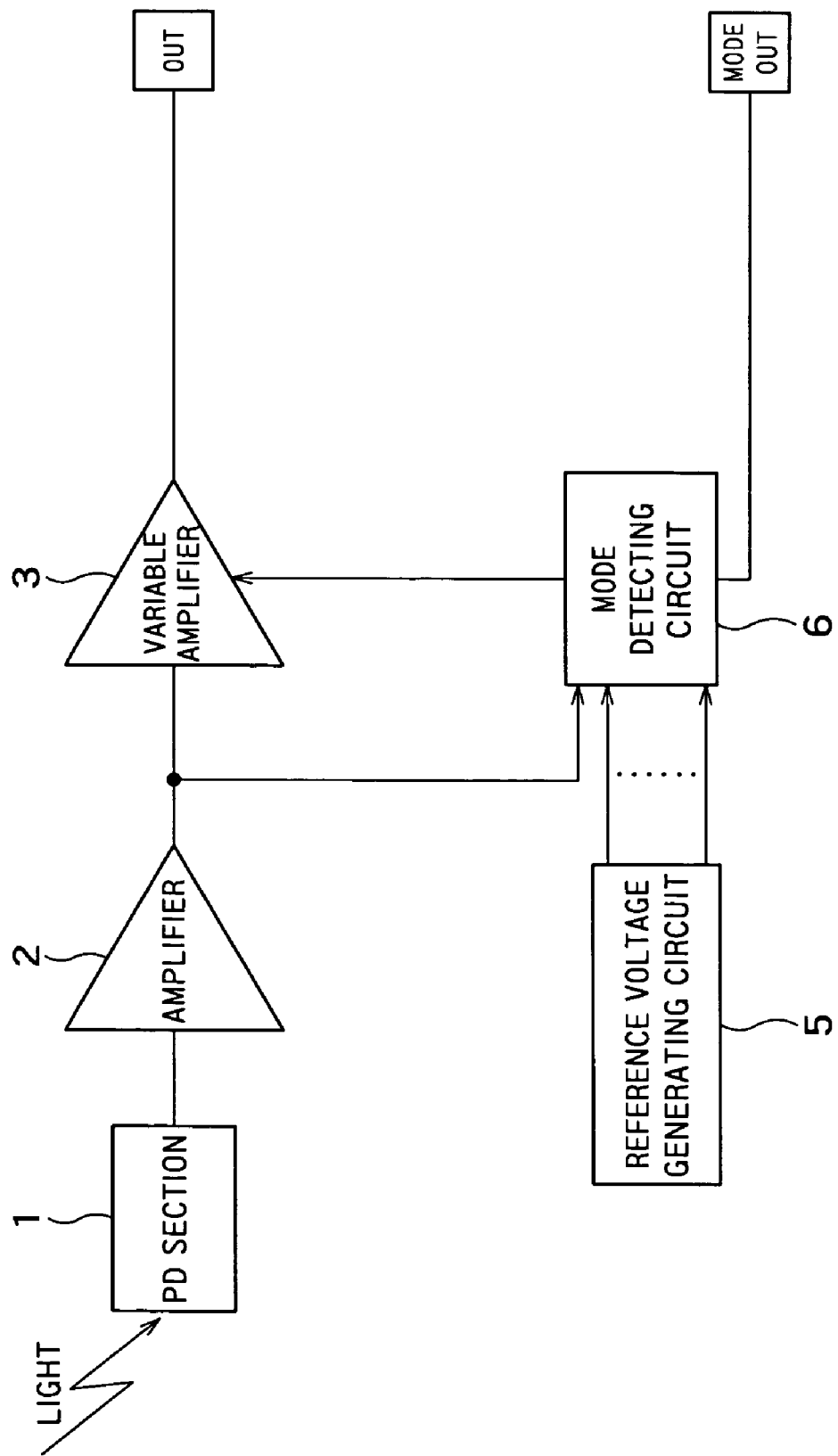
FIG. 9B is a block diagram of an illuminance sensor including one variable amplifier 3 in place of the plurality of amplifiers A1 to An.

FIG. 9B is a block diagram of an illuminance sensor including one variable amplifier 3 in place of the plurality of amplifiers A1 to An. The variable amplifier 3 can change the gain thereof in n steps on the basis of a signal from the mode detecting circuit 6.

As a result, the illuminance sensor shown in FIG. 9B has the same effect as that of the illuminance sensor shown in FIG. 9A. Furthermore, the illuminance sensor shown in FIG. 9B has only one amplifier as the second amplifier and does not need a switch. Therefore, the illuminance sensor shown in FIG. 9B can achieve a relatively small chip size.

(Fifth Embodiment)

A fifth embodiment will be described below with reference to FIGS. 10 to 13.

Figure 10:
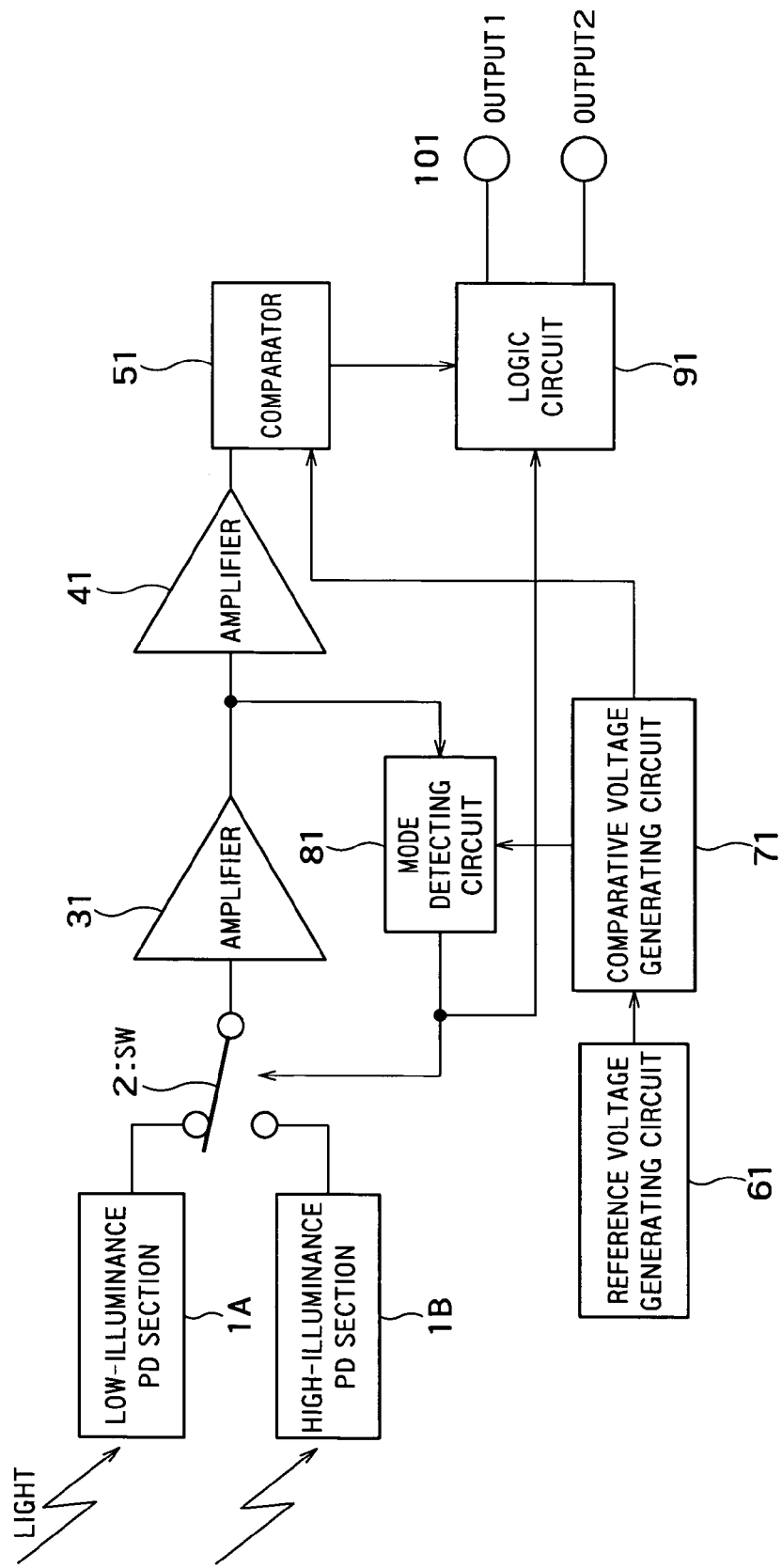
FIG. 10 is a circuit block diagram of an illuminance sensor for explaining the fifth embodiment.

FIG. 10 is a circuit block diagram of an illuminance sensor for explaining the fifth embodiment. FIG. 11 is a graph for explaining an operation of the illuminance sensor in FIG. 10. FIG. 12 shows an embodiment of a logic circuit constituting the illuminance sensor in FIG. 10. FIG. 13 is a table showing a relationship between an illuminance of light being incident on the illuminance sensor and an output from the illuminance sensor.

As shown in FIG. 10, a photodiode sections are constituted by a high-illuminance photodiode section 1A and a low-illuminance photodiode section 1B. A first amplifier 31 is constituted by at least one amplifier, and converts an output (signal current) from the photodiode sections 1A and 1B into a voltage to amplify the signal. The first amplifier 31 outputs the amplified signal to a second amplifier 41.

The second amplifier 41 is constituted by at least one amplifier, and may have a characteristic such as a gain different from the first amplifier 31. The second amplifier 41 further amplifies a signal from the first amplifier 31 to output the amplified signal to the reference voltage generating circuit 61.

The illuminance sensor includes a switch 21 which monitors an output from the first amplifier 31 to switch the photodiode sections 1A and 1B when the illuminance becomes a certain threshold illuminance and a mode detecting circuit 81 for controlling the switch 21. The switch 21 receives an output signal from the detecting circuit 81 to switch a signal to be input to the first amplifier 31.

The illuminance sensor has a reference voltage generating circuit 61 such as a bandgap constant voltage circuit and a comparative voltage generating circuit 71 which generates a comparative reference voltage on the basis of an output from the reference voltage generating circuit 61. The mode detecting circuit 81 compares an output voltage of the comparative voltage generating circuit 71 and an output from the first amplifier 31 to control a mode of the switch 21.

An output from the second amplifier 41 is input to at least one (one in this embodiment) comparator 51. The comparator 51 compares the output from the second amplifier 41 with the output voltage of the comparative voltage generating circuit 71 to output a logic signal. A logic circuit 91 receives the logic circuit from the comparator 51 and the logic circuit from the mode detecting circuit 81 to output a digital signal to the output section 101. An example of the logic circuit 91 is shown in FIG. 12. The illuminance sensor according to the embodiment is formed on one semiconductor chip.

Figure 11A:
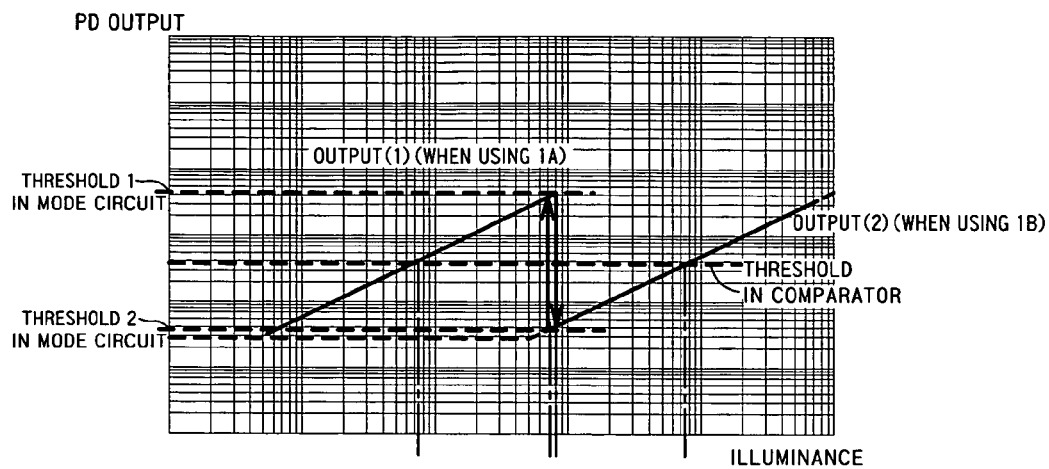
FIG. 11A to 11C are graphs for explaining an operation of the illuminance sensor in FIG. 10.
Figure 11B:
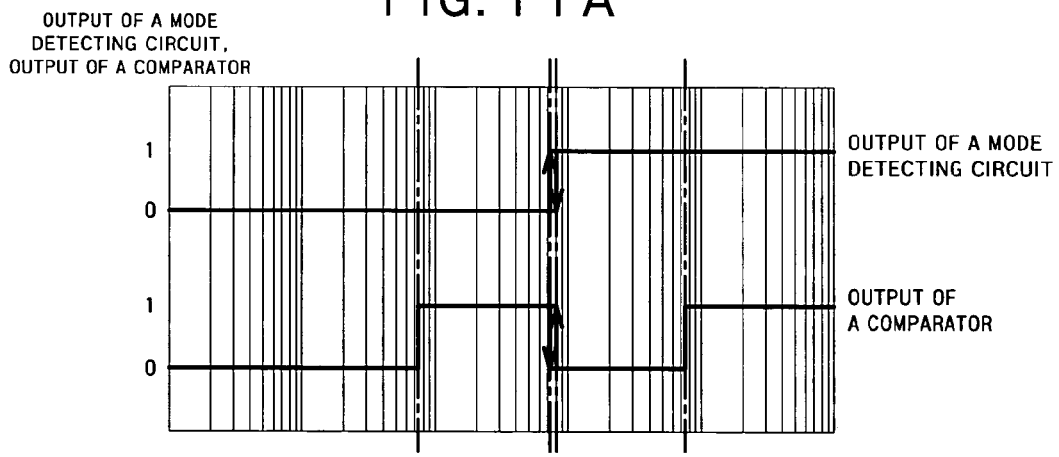
Figure 11C:
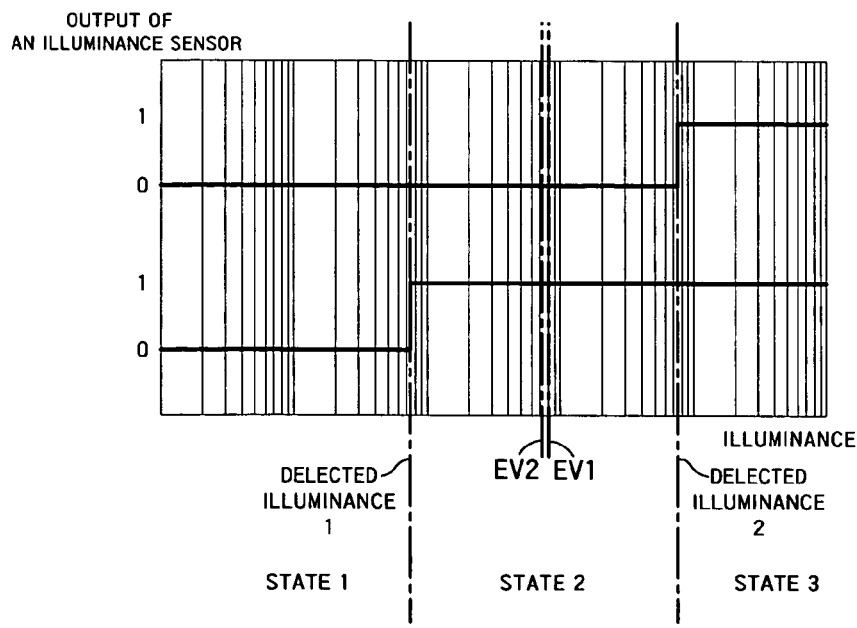
Figures 12, 13:
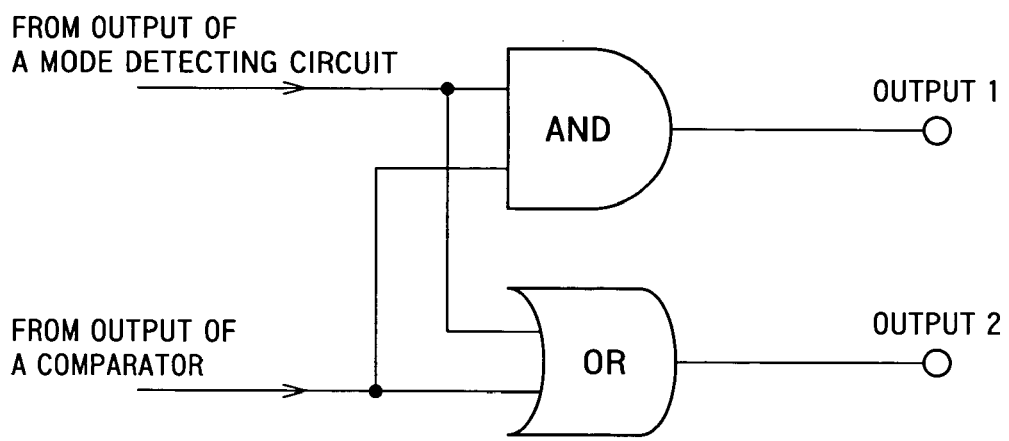
FIG. 12 shows an embodiment of a logic circuit constituting the illuminance sensor in FIG. 10.
FIG. 13 is a table showing a relationship between an illuminance of light being incident on the illuminance sensor and an output from the illuminance sensor.

The abscissas in FIGS. 11A to 11C indicate illuminances of light being incident on the illuminance sensor. The abscissa in FIG. 11A shows an output from a photodiode sections 1A and 1B. The ordinate in FIG. 11B shows outputs of the mode detecting circuit and the comparator. The ordinate in FIG. 11C shows an output the illuminance sensor.

FIG. 11D shows a state of an illuminance of light input to the illuminance sensor shown in FIG. 13. FIG. 11C shows an output from the illuminance sensor corresponding to the state. FIG. 11A shows an illuminance-output characteristic line (1) when a low-illuminance photodiode section 1A is used and an illuminance-output characteristic line (2) when a high-illuminance photodiode section 1B is used. Any one of the characteristic lines (1) and (2) is applied depending on the state of the illuminance of light input to the illuminance sensor.

An operation of the illuminance Example 1 will be described below with reference to FIGS. 11A to 11D.

When light of a certain illuminance is irradiated on the illuminance sensor, the light is converted into a current in a high-sensitive low-illuminance photodiode 1A or a low-sensitive low-illuminance photodiode 1B. The low-illuminance photodiode section 1A has an illuminance-output characteristic which is linear in a range of several lux to several hundred lux. The high-illuminance photodiode section 1B has an illuminance-output characteristic which is linear in a range of several lux to several tens of thousand lux.

In general, since a photodiode has an output saturated with respect to an illuminance in a region except for a linear region, the photodiode is not suitable for detection of an illuminance in the region except for the linear region.

Therefore, a switching illuminance (threshold illuminance EV1) is set between the linear region of the low-illuminance photodiode section 1A and the linear region of the high-illuminance photodiode section 1B.

The configurations of the low-illuminance photodiode section 1A and the high-illuminance photodiode section 1B may be the same as those shown in FIGS. 4A to 4C.

In the initial state, the switch 21 selects the low-illuminance photodiode section 1A (state shown in FIG. 10). In this state, when light of a certain illuminance is irradiated on the illuminance sensor, the illuminance of the incident light is detected by the low-illuminance photodiode section 1A and the first amplifier 31. At this time, a relationship between the illuminance and the illuminance sensor output depends on the illuminance-output characteristic line (1) of the low-illuminance photodiode section 1A in FIG. 11A (this is celled a low-illuminance mode).

The switch 21 switches signals output from the photodiode sections to the first amplifier 31. When the incident light is amplified to change the illuminance into the threshold illuminance EV1 (see FIG. 11A), an output from the first amplifier 31 becomes a predetermined "mode circuit threshold value 1 (first reference voltage)". When the mode detecting circuit 81 detects that the output from the first amplifier 31 exceeds the mode circuit threshold value 1, the mode detecting circuit 81 inverts the output (first logic signal) (for example 0→1). In this manner, the switch 21 switches the mode to the high-illuminance photodiode section 1B.

At this time, although the output from the first amplifier 31 decreases, the threshold value of the switch (SW) 21 is switched to a predetermined "mode circuit threshold value 2 (second reference voltage)". For this reason, the switch 21 keeps the selection of the high-illuminance photodiode section 1B. At this time, a relationship between an illuminance and an illuminance sensor output depends on the illuminance-output characteristic line (2) in FIG. 11A (this is called a high-illuminance mode).

When the illuminance decreases to EV2 after the high-illuminance mode is set, the mode detecting circuit 81 detects that the output from the first amplifier 31 is lower than the "mode circuit threshold value 2" to invert the output (first logic signal) of the mode detecting circuit 81 (0→1). In this manner, when the switch 21 switches the mode to the low-illuminance photodiode section 1A. At this time, although the output from the first amplifier 31 increases, the threshold value of the mode detecting circuit 81 is switched to the "mode circuit threshold value 1". For this reason, the switch 21 keeps the selection of the low-illuminance photodiode section 1A.

The comparator 51 compares an output voltage of the second amplifier 41 with the second reference voltage to output a second logic circuit based on the comparison result. The second reference voltage is a voltage (comparator threshold value) depending on an illuminance desired to be detected. In the embodiment, when the output voltage of the second amplifier 41 exceeds the second reference voltage (detection illuminance 1 and detection illuminance 2) generated by the comparative voltage generating circuit 71, the second logic circuit from the comparator 51 changes from "0" to "1".

In the embodiment, since a digital value is output, the second reference voltage corresponding to the illuminance desired to be detected is set at detection illuminance 1 (for example, 100 lux) and detection illuminance 2 (for example, 50000 lux).

The logic circuit 91 calculates the first logic signal and the second logic signal to make it possible to discriminate the illuminance. For example, as shown in FIG. 12, the AND and OR between the first logic signal and the second logic signal are calculated. The calculation results make it possible to discriminate three illuminance ranges as shown in FIG. 13.

More specifically, the logic circuit 91 is shown in FIG. 12, for example. An output 1 in the output section 101 of the illuminance sensor is obtained by calculating an output (first logic signal) of the mode detecting circuit 81 and an output (second logic signal) of the comparator 51 by an AND circuit. When the first logic signal/second logic signal is given by 1/1, 0/1, 1/0, and 0/0, the output 1 becomes 1, 0, 0, and 0, respectively.

An output 2 is obtained by calculating an output (first logic signal) of the mode detecting circuit 81 and an output (second logic signal) of the comparator 51 by an OR circuit. When the first logic signal/second logic signal is given by 1/1, 0/1, 1/0, and 0/0, the output 2 becomes 1, 1, 1, and 0, respectively. By the outputs 1 and 2, it can be known the illuminance sensor is set in any one of states 1 to 3 shown in FIG. 13 is set the illuminance sensor.

In the state 1, the low-illuminance photodiode section 1A is used. In the state 2, the low-illuminance and high-illuminance photodiode sections 1A or 1B is selectively used depending on an detection illuminance. In the third state, the high-illuminance photodiode section 1B is used.

The reference voltage generating circuit 61 includes a bandgap circuit or the like which is not easily changed by temperature. The reference voltage generating circuit 61 generates a comparative voltage matched with an illuminance desired to be detected by a voltage converting circuit using resistance division or an operational amplifier as the voltage for the bandgap circuit, and supplies the voltage to the comparative voltage generating circuit 71.

In this configuration, for the illuminance desired to be detected, the sensitivity of the photodiode section 1A or 1B is adjusted by using the second reference voltage of the comparator 51 as one voltage. However, as in the sixth embodiment, the comparator 51 may be arranged, and the plurality of second reference voltages may be set.

In the fifth embodiment, the two low-illuminance and high-illuminance photodiode sections 1A and 1B having different illuminance-output characteristics are independently arranged and switched to each other to make it possible to obtain a digital output which can be accurately detected in a range of a low illuminance, i.e., several lux to a high illuminance, i.e., several tens of thousand lux.

(Sixth Embodiment)

Figure 14:
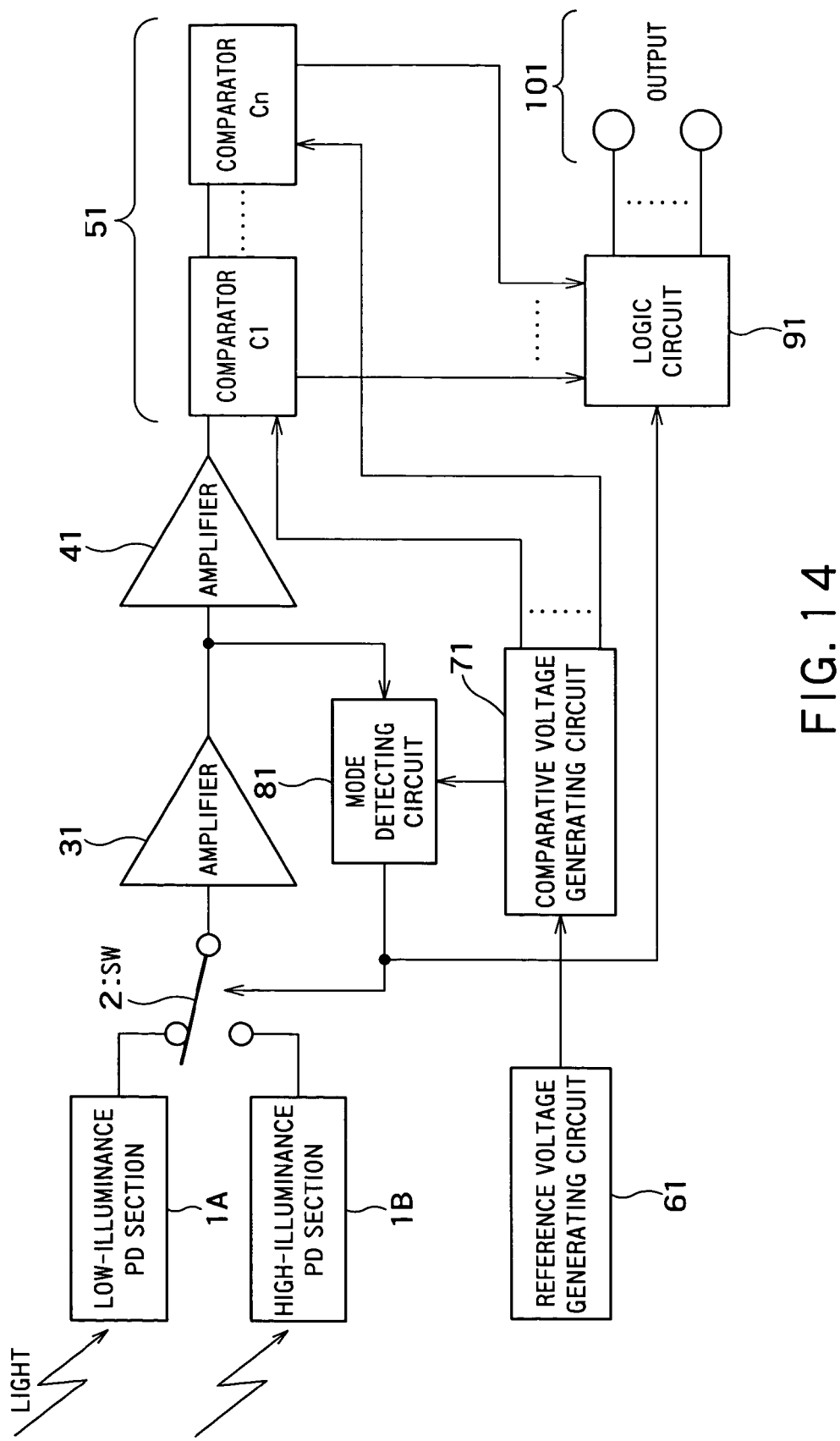
FIG. 14 is a circuit block diagrams of an illuminance sensor according to a sixth embodiment.
Figure 15:
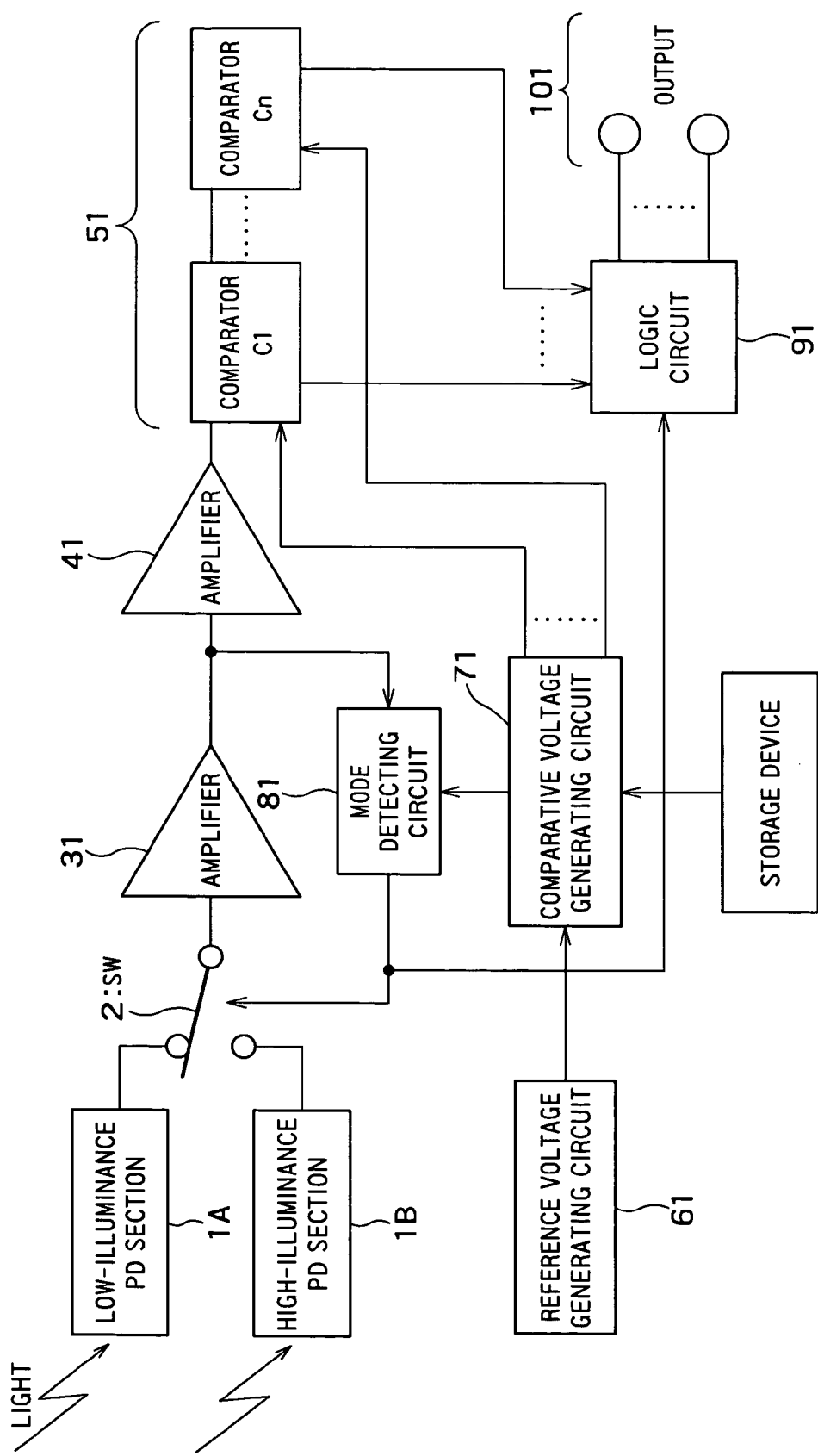
FIG. 15 is a circuit block diagrams of an illuminance sensor according to a modification of the sixth embodiment.

FIGS. 14 and 15 are circuit block diagrams of an illuminance sensor according to a sixth embodiment. The sixth embodiment will be described below with reference to FIGS. 14 and 15. Although one comparator is used in the fifth embodiment, the sixth embodiment includes a plurality of comparators as a characteristic feature.

As a photodiode section used in the sixth embodiment, a photodiode section having the same characteristics as those in the first embodiment may be used. However, the photodiode section is not limited to the photodiode section in the first embodiment. As amplifiers 31 and 41, amplifiers having equal characteristics such as equal amplification degrees may be used, or amplifiers having different characteristics may be used.

As shown in FIG. 14, a photodiode section is constituted by a plurality of photodiode sections 1A and 1B having different illuminance-output characteristics. An output from the photodiode sections 1A and 1B are input to the first amplifier 31 through a switch (SW) 2. The photodiode section 1B includes the high-sensitive low-illuminance photodiode and the photodiode section 1A includes the low-sensitive high-illuminance photodiode. The first amplifier 31 constituted by at least one amplifier converts an output (signal current) from the photodiode sections 1A or 1B and amplifies the output. The first amplifier 31 outputs the amplified signal to the second amplifier 41 constituted by at least one amplifier. The first and second amplifiers 31 and 41 may have equal characteristics or different characteristics. The second amplifier 41 further amplifies the signal from the first amplifier 31 to output the amplified signal to a comparator group 51.

The illuminance sensor includes the switch 21 which monitors an output from the first amplifier 31 to switch the photodiode sections 1A and 1B when the illuminance becomes a certain threshold illuminance and a mode detecting circuit 81 which controls the switch 21. The switch 21 receives an output signal from the mode detecting circuit 81 to switch a signal to be input to the first amplifier 31.

The illuminance sensor further includes a reference voltage generating circuit 61 such as a bandgap constant voltage circuit and a comparative voltage generating circuit 71 which generates a first reference voltage and a plurality of second reference voltages on the basis of an output from the reference voltage generating circuit 61. The mode detecting circuit 81 compares the first reference voltage from the comparative voltage generating circuit 71 with an output voltage from the first amplifier 31 to control a mode of the switch 21 by a first logic signal based on the comparison result.

An output from the second amplifier 41 is input to the comparator group 51 including n comparators C1 to Cn. The comparator group 51 compares an output voltage from the second amplifier 41 with the plurality of second reference voltages from the comparative voltage generating circuit 71 to output a second logic signal on the basis of the comparison result.

An operation of the sixth embodiment will be described below.

When light of a certain illuminance is irradiated on the illuminance sensor, the light is converted into a current in the high-sensitive low-illuminance photodiode 1A or the low-sensitive low-illuminance photodiode 1B. The low-illuminance photodiode section 1A is designed to obtain a photoelectric current larger than that of the high-illuminance photodiode section 1B with respect to the light being incident on the illuminance sensor.

The switch 21 is arranged to switch signals transmitted from the photodiode sections 1A or 1B to the first amplifier 31. In the initial state, the switch 21 selects the low-illuminance photodiode section 1A (state shown in FIG. 14). When the illuminance of the incident light increases to a threshold illuminance EV1 corresponding to a "mode circuit threshold value 1 (first reference voltage)" of the mode detecting circuit 81 (see FIG. 11A), an output from the first amplifier 31 reaches the "mode circuit threshold value 1". In this manner, an output (first logic signal) from the mode detecting circuit 81 is inverted, and the switch 21 is switched to a high-illuminance photodiode section 1B.

At this time, although an output from the first amplifier 31 decreases, the threshold value of the mode detecting circuit 81 is switched to a "mode circuit threshold value 2 (second reference voltage)". For this reason, the switch 21 keeps the selection of the high-illuminance photodiode section 1B.

After the shift to the high-illuminance mode, when the illuminance decreases a threshold illuminance EV2 corresponding to a "mode circuit threshold value 1", the mode detecting circuit 81 inverts the output therefrom (first logic signal). At this time, an output from the first amplifier 31 increases. However, since the threshold value of the mode detecting circuit 81 is switched to the "mode circuit threshold value 1", the switch 21 keeps the selection of the low-illuminance photodiode section 1A.

The plurality of comparators C1 to Cn compare the output voltage from the second amplifier 41 with the plurality of reference voltages of the comparative voltage generating circuit 71 corresponding to an illuminance desired to be detected, and output second logic signals of a plurality of bits on the basis of the comparison result.

The reference voltage generating circuit 61 includes a bandgap circuit or the like which is not easily changed by temperature. The reference voltage generating circuit 61 generates a comparative voltage matched with an illuminance desired to be detected by a voltage converting circuit using resistance division or an operational amplifier as the voltage for the bandgap circuit, and supplies the voltage to the comparative voltage generating circuit 71.

Although one second reference voltage for a comparator is set to an illuminance desired to be detected in the fifth embodiment, the plurality of comparative potential and the plurality of comparators are set in the sixth embodiment. More specifically, the plurality of comparators C1, C2, . . . , Cn are prepared.

The comparative voltage generating circuit 71 generates n outputs (second reference voltages) corresponding to the number of comparators and inputs the outputs to the plurality of comparators C1, C1, . . . , Cn. The comparators C1, C1, . . . , Cn compare the second reference voltage with an output voltage from the second amplifier 41 and outputs a second logic signal to the logic circuit 91 on the basis of the comparison result.

The logic circuit 91 calculates the first logic signal and the second logic signal. The comparison result makes it possible to discriminate an illuminance. Comparators the number of which is the necessary number of detection values are arranged, and the first and second logic signals are calculated by the logic circuit 91, so that output lines can be reduced in number. For example, when seven values are to be detected, an output can be made by a combination of "0" and "1" of three bits (three lines).

An illuminance sensor according to a modification of the sixth embodiment will be described below with reference to FIG. 15.

The illuminance sensor according to this modification basically has the same structure as that of the illuminance sensor shown in FIG. 14. In the modification, an output from a storage device 110 such as a ROM is input to the comparative voltage generating circuit 71. The storage device 110 incorporates the comparative voltage generating circuit to make it possible to easily change a detection illuminance as needed.

Furthermore, for example, a rewritable storage device such as an EPROM is used as the storage device 110, correction values such as a variation of sensitivity caused by manufacturing or packaging in the storage device 110 can be electrically rewritten after the manufacturing or packaging. In this manner, in the comparative voltage generating circuit 71, a variation of the first or second reference voltage can be corrected. As a result, the accuracy of the illuminance sensor can be further improved.

In the sixth embodiment, not only the two modes for a high illuminance and a low illuminance, but also, e.g., an intermediate-illuminance mode can be set. That is, three or more modes can be set.

In the sixth embodiment, the two low-illuminance and high-illuminance photodiode sections 1A and 1B having different illuminance-output characteristics are independently arranged and switched to each other to make it possible to obtain a digital output which can be accurately detected in a range of a low illuminance, i.e., several lux to a high illuminance, i.e., several tens of thousand lux.

(Seventh Embodiment)

Figure 16:
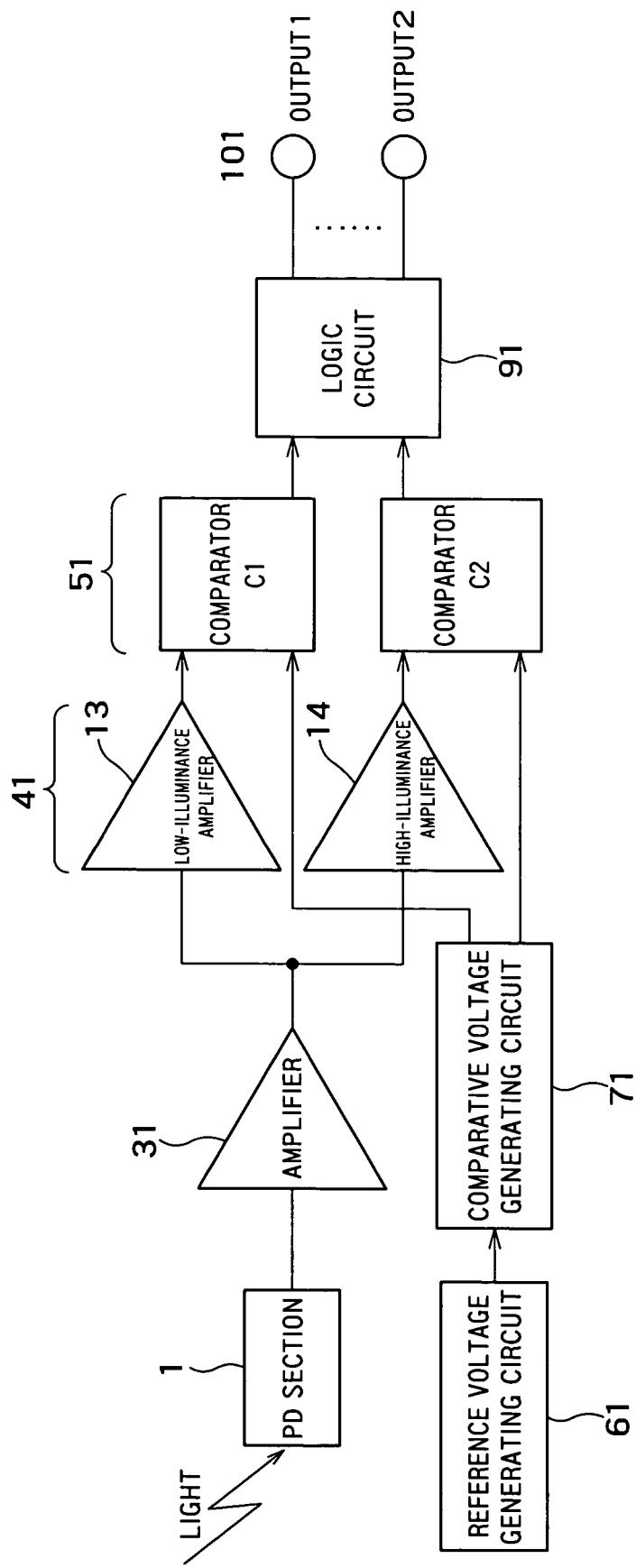
FIG. 16 is a circuit block diagram of an illuminance sensor for explaining a seventh embodiment.

FIG. 16 is a circuit block diagram of an illuminance sensor for explaining a seventh embodiment. FIG. 17 is a graph for explaining an operation of the illuminance sensor in FIG. 16.

The seventh embodiment has the following characteristic feature. That is, a plurality of amplifiers 13 and 14 having different characteristics such as different amplification degrees are switchably used. In addition, the illuminance sensor according to the embodiment includes comparators C1 and C2 connected to the outputs of the plurality of amplifiers 13 and 14.

The illuminance-output characteristic of a photodiode section 1 used in the seventh embodiment may be the same as that of the photodiode section 1A or 1B in the first embodiment or may be different from that. The same is true on the amplifiers.

The photodiode section 11 has an output connected to a first amplifier 31. The first amplifier 31 converts an output (signal current) from the photodiode section 11 into a voltage to amplify the output. The first amplifier 31 outputs the amplified output to a second amplifier 41. The illuminance sensor further includes a reference voltage generating circuit 61 such as a bandgap constant voltage circuit serving as a source of comparative reference voltages of the plurality of comparators C1 and C2 and a comparative voltage generating circuit 71 which generates a comparative reference voltage on the basis of an output from the reference voltage generating circuit 61.

The second amplifier 41 is constituted by the low-illuminance amplifier 13 having a high amplification degree and the high-illuminance amplifier 14 having a low amplification degree.

The low-illuminance amplifier 13 has an illuminance-output characteristic which is linear in a range of several lux to several hundred lux obtained by converting an input photoelectric current into an illuminance. The high-illuminance amplifier 14 has an illuminance-output characteristic which is linear in a range of several hundred lux to several tens of thousand lux. The amplifiers 13 and 14 output constant voltages for an input in a range except for the linear range. A switching illuminance is set in a range in which both the linear ranges of the low-illuminance amplifier 13 and the high-illuminance of amplifier 14 overlap.

An output from the second amplifier group 41 is input to the comparator 51. The comparator 51 compares an output from the second amplifier group 41 with an output voltage (reference voltage) from the comparative voltage generating circuit 71 to output a logic signal based on the comparison result. The comparator 51 is constituted by a first comparator C1 and a second comparator C2. An output from the low-illuminance amplifier 13 is input to the first comparator, and an output from the high-illuminance amplifier 14 is input to the second comparator.

A logic circuit 91 logically calculates logic signals from the comparators C1 and C2 to digitally output the calculation results to an output section 101. The illuminance sensor according to the seventh embodiment is formed on one semiconductor chip.

Figure 17A:
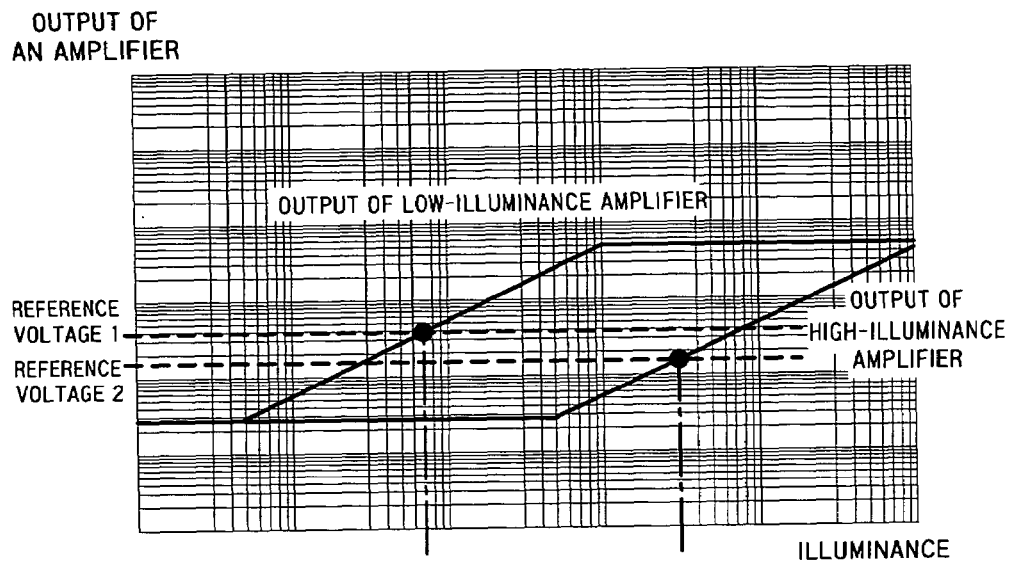
FIGS. 17A and 17B are graphs for explaining an operation of the illuminance sensor in FIG. 16.
Figure 17B:
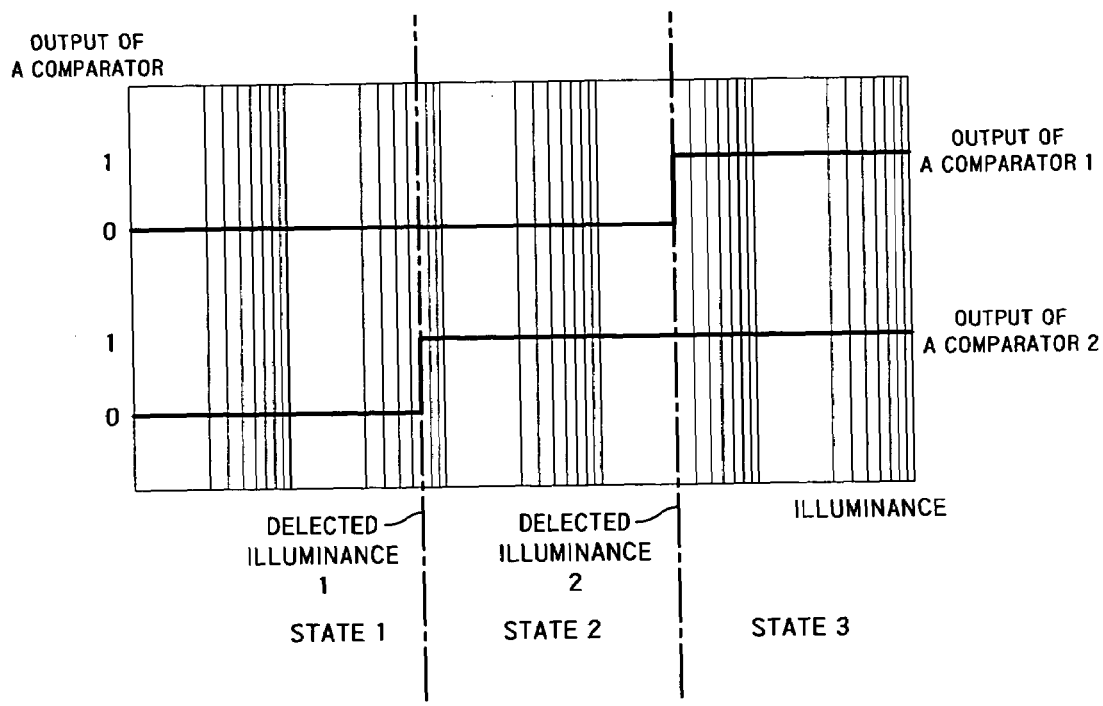

FIGS. 17A to 17C show characteristics between output voltages from the amplifiers 13 and 14 to explain an operation of the illuminance sensor according to the seventh embodiment. When light of a certain illuminance is irradiated on the illuminance sensor, the light is converted into a current in the photodiode section 11 and amplified by the first amplifier 31. The low-illuminance amplifier 13 and the high-illuminance amplifier 14 amplify an output signal from the first amplifier 31 by a set amplification degree in accordance with an illuminance desired to be detected. The comparators C1 and C2 compare output voltages from the low-illuminance amplifier 13 and the high-illuminance amplifier 14 with the voltage (reference voltage) matched with the illuminance desired to be detected, respectively. The illuminance desired to be detected includes detection illuminance 1 and detection illuminance 2. The comparator 1 detects the detection illuminance 2, and the comparator 2 detects the detection illuminance 1. A voltage corresponding to the detection illuminance 1 is reference voltage 1, and a voltage corresponding to the detection illuminance 2 is reference voltage 2. In the embodiment, when the incident light has an illuminance higher than the illuminance desired to be detected, outputs from the comparators C1 and C2 change from "0" to "1". More specifically, when the illuminance of the incident light exceeds the detection illuminance 1, the output from the comparator C1 changes from "0" to "1". When the illuminance of the incident light exceeds the detection illuminance 2, the output from the comparator C2 changes from "0" to "1".

With the above configuration, the illuminance can be discriminated by checking the digital output from the comparators C1 and C2. As shown in FIG. 17C, illuminances to be detected can be sorted into state 1, state 2, and state 3. The illuminance in the state 1 is lower than the detection illuminance 1, the illuminance in the state 2 is higher than the detection illuminance and lower than the detection illuminance 2, and the illuminance in the state 3 is higher than the detection illuminance 2. These states 1 to 3 can be understood by detecting the outputs from the comparators C1 and C2. C1/C2 is 0/0 in the state 1, C1/C2 is 0/1 in the state 2, and C1/C2 is 1/1 in the state 3.

Furthermore, a logic circuit 91 is arranged to make it possible to output various combinations of output logics as needed. For example, as the logic circuit 91, the AND circuit and the OR circuit in FIG. 12 are used. However, in FIG. 12, the "mode detection" is rewritten with an "output from the comparator C1", and the "comparator detection" is rewritten with an "output from the comparator C2".

In this case, digital output 1 in the output section 101 is obtained by calculating the output (first logic signal) from the comparator C1 and an output (second logic signal) from the comparator C2 by the AND circuit. When (output from the comparator C1)/(output from the comparator C2) is given by 1/1, 0/1, and 0/0, the output 1 becomes 1, 0, and 0, respectively.

Digital output 2 in the output section 101 is obtained by calculating the output from the comparator C1 and the output from the comparator C2 by the OR circuit. When (output from the comparator C1)/(output from the comparator C2) is given by 1/1, 0/1, and 0/0, the output 2 becomes 1, 1, and 0, respectively. Therefore, the illuminance sensor is set in the state 1 when output 1/output 2 is 0/0, set in the state 2 when output 1/output 2 is 0/1, and set in the state 3 when output 1/output 2 is 1/1.

The reference voltage generating circuit 61 includes a bandgap circuit or the like which is not easily changed by temperature. The reference voltage generating circuit 61 generates a comparative voltage matched with an illuminance desired to be detected by a voltage converting circuit using resistance division or an operational amplifier as the voltage for the bandgap circuit, and supplies the voltage to the comparative voltage generating circuit 71.

In the configuration, comparative reference voltages 1 and 2 are adjusted for an illuminance desired to be detected and made different from each other. However, the reference voltage 1 and the reference voltage 2 may be made equal to each other to match the amplification degrees of the low-illuminance amplifiers 13 and 14. As a matter of course, both the comparative potential and the amplification degrees may be used.

In the above example, the amplification degrees of the high-illuminance amplifier and the low-illuminance amplifier are made different from each other. However, the amplification degrees of the amplifiers may be made equal to each other, and the sensitivities of the photodiode sections may be made different from each other. More specifically, a low-sensitive photodiode section may be used for a high illuminance, and a high-sensitive photodiode section may be used for a low illuminance. As a matter of course, the sensitivities of the photodiode sections may be made different from each other, and the amplification degrees of the amplifiers may be made different from each other.

In the seventh embodiment, the two amplifiers having high and low different amplification degrees and being suitable for a low illuminance and a high illuminance are independently arranged and switched to each other. In this manner, a digital output which can be accurately detect in an illuminance range of a low illuminance, i.e., several lux to a high illuminance, i.e., several tens of thousand lux.

(Eighth Embodiment)

Figure 18:
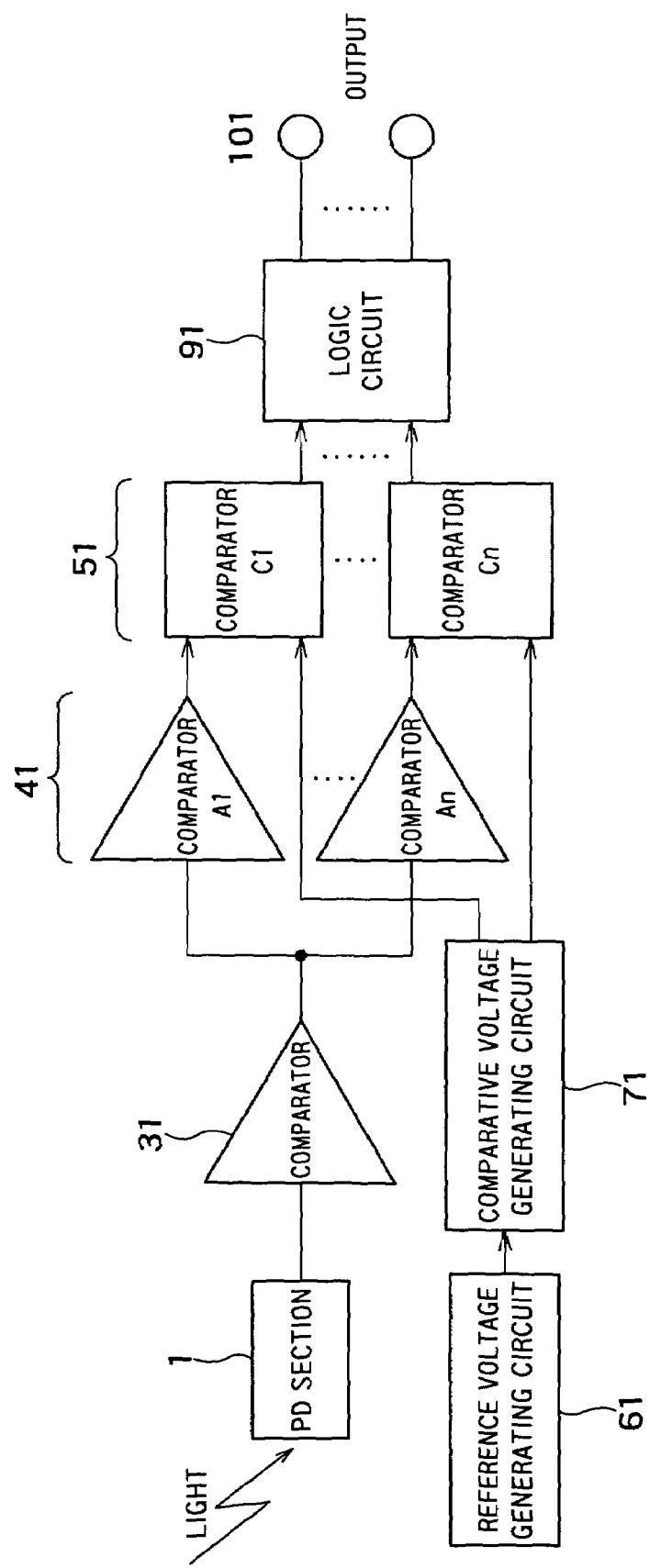
FIG. 18 is a circuit block diagram of an illuminance sensor to explain an eighth embodiment.
Figure 19:
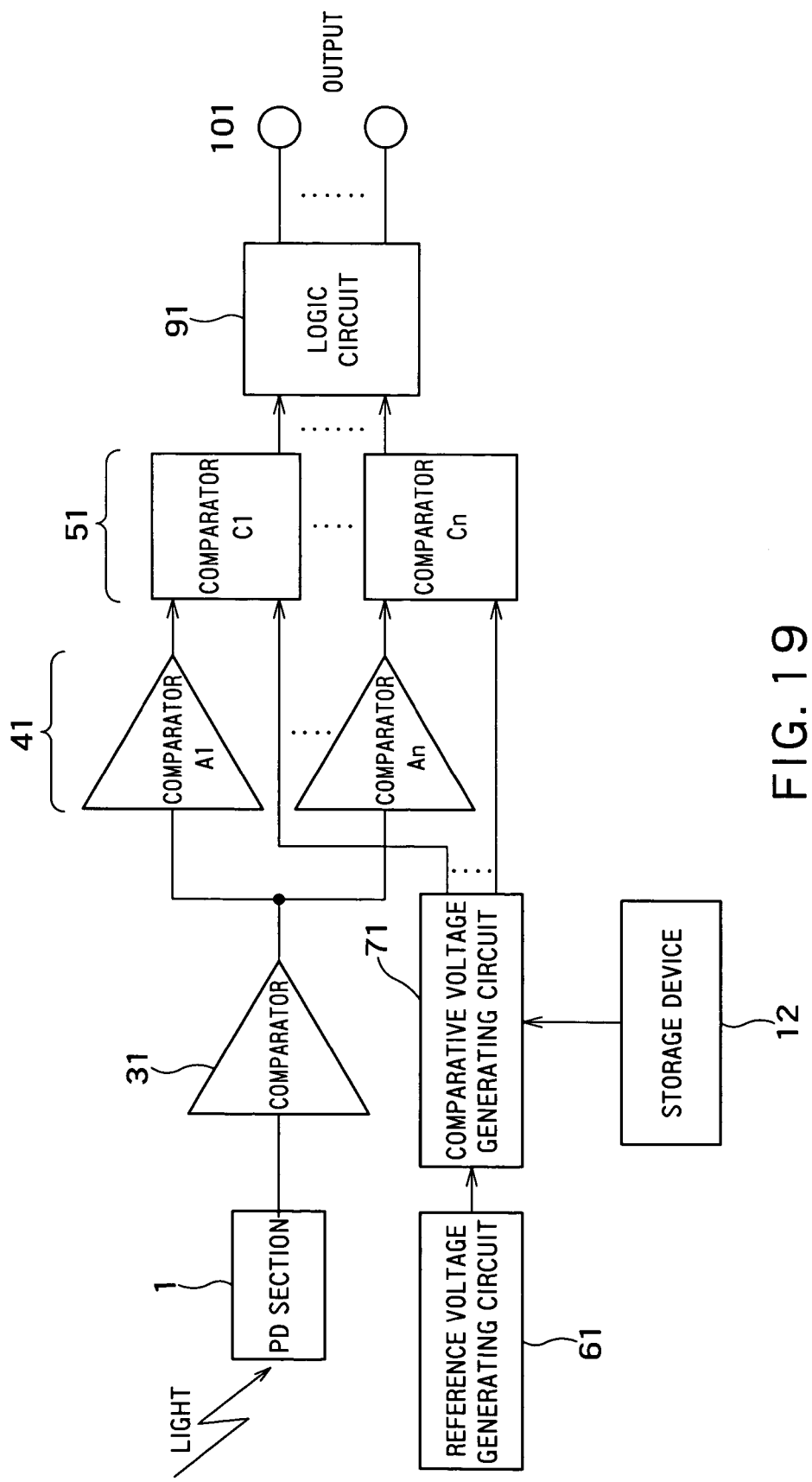
FIG. 19 is a circuit block diagram of an illuminance sensor to explain a modification of the eighth embodiment.

FIGS. 18 and 19 are circuit block diagrams of an illuminance sensor to explain an eighth embodiment. The eighth embodiment has the following characteristic feature. That is, a plurality of amplifiers having different characteristics such as amplification degrees are appropriately switchably used.

As shown in FIG. 18, a photodiode section 11 has an output connected to a first amplifier 31. The first amplifier 31 converts an output (signal current) from the photodiode section 11 into a voltage to amplify the output. The first amplifier 31 outputs the amplified signal to a second amplifier 41.

The illuminance sensor further includes a reference voltage generating circuit 61 including a bandgap constant voltage circuit or the like serving as a source of comparative reference voltages of a comparator group 51 and a comparative voltage generating circuit 71 which generates a comparative reference voltage on the basis of an output from the reference voltage generating circuit 61.

The second amplifier 41 is constituted by a plurality of amplifiers A1, A2, . . . , An having different amplification degrees. The comparator group 51 is constituted by comparators C1, C1, . . . , Cn corresponding to the amplifiers A1, A2, . . . , An. Outputs from the amplifiers A1, A2, . . . , An are input to the corresponding comparators C1, C1, . . . , Cn, respectively. The comparators C1, C1, . . . , Cn compare output voltages from the amplifiers A1, A2, . . . , An with an output voltage (reference voltage) from the comparative voltage generating circuit 71 to output logic signals on the basis of the comparison result. An output from the low-illuminance amplifier A1 is input to the first comparator C1. An output from the high-illuminance amplifier An is input to the nth comparator Cn.

A logic circuit 91 is connected to outputs of a comparator group 51. The logic circuit 91 logically calculates outputs (logic signals) from the comparator group 51 to digitally output the calculation results to an output section 101. The illuminance sensor according to the eighth embodiment is formed on one semiconductor chip.

Although the two threshold illuminances are set in the seventh embodiment, three or more (n) threshold illuminances may be set by arranging comparative potential and comparators the numbers of which are equal to the number of necessary values as in the eighth embodiment or arranging one comparative potential and amplifiers and comparators the numbers of which are equal to the number of necessary values.

The logic circuit 91 is arranged to make it possible to reduce output lines in number. For example, seven values are detected, a combination of values "0" and "1" of three bits (three lines) can be output.

The reference voltage generating circuit 61 includes a bandgap circuit or the like which is not easily changed by temperature. The reference voltage generating circuit 61 generates a comparative voltage matched with an illuminance desired to be detected by a voltage converting circuit using resistance division or an operational amplifier as the voltage for the bandgap circuit, and supplies the voltage to the comparative voltage generating circuit 71.

In the configuration, comparative reference voltages are adjusted for an illuminance desired to be detected. However, only one reference voltage may be set, and the amplification degrees of the amplifiers may be made equal to each other. As a matter of course, both the comparative potential and the amplification degrees may be used.

In the eighth embodiment, the plurality of amplifiers (second amplifiers) having different amplification degrees are independently arranged and switched to each other to make it obtain a digital output which can be accurately detected in an illuminance range of a low illuminance, i.e., several lux to a high illuminance, i.e., several tens of thousand lux.

A modification of the eighth embodiment will be described below with reference to FIG. 19.

An illuminance sensor according to this modification basically has the same structure as that of the illuminance sensor shown in FIG. 18. In the modification, an output from a storage device 12 such as a ROM is input to the comparative voltage generating circuit 71. The storage device 12 incorporates the comparative voltage generating circuit to make it possible to easily change a detection illuminance as needed.

Furthermore, for example, a rewritable storage device such as an EPROM is used as the storage device 12, correction values such as a variation of sensitivity caused by manufacturing or packaging in the storage device 12 can be electrically rewritten after the manufacturing or packaging. In this manner, in the comparative voltage generating circuit 71, a variation of the first or second reference voltage can be corrected. As a result, the accuracy of the illuminance sensor can be further improved.

In the eighth embodiment, not only the two modes for a high illuminance and a low illuminance, but also, e.g., an intermediate-illuminance mode can be set. That is, three or more modes can be set.

In the eighth embodiment, the plurality of amplifiers having different amplification degrees are independently arranged and switched to each other to make it possible to obtain a digital output which can be accurately detected in a range of a low illuminance, i.e., several lux to a high illuminance, i.e., several tens of thousand lux.

(Ninth Embodiment)

A ninth embodiment will be described below with reference to FIG. 20.

Figure 20:
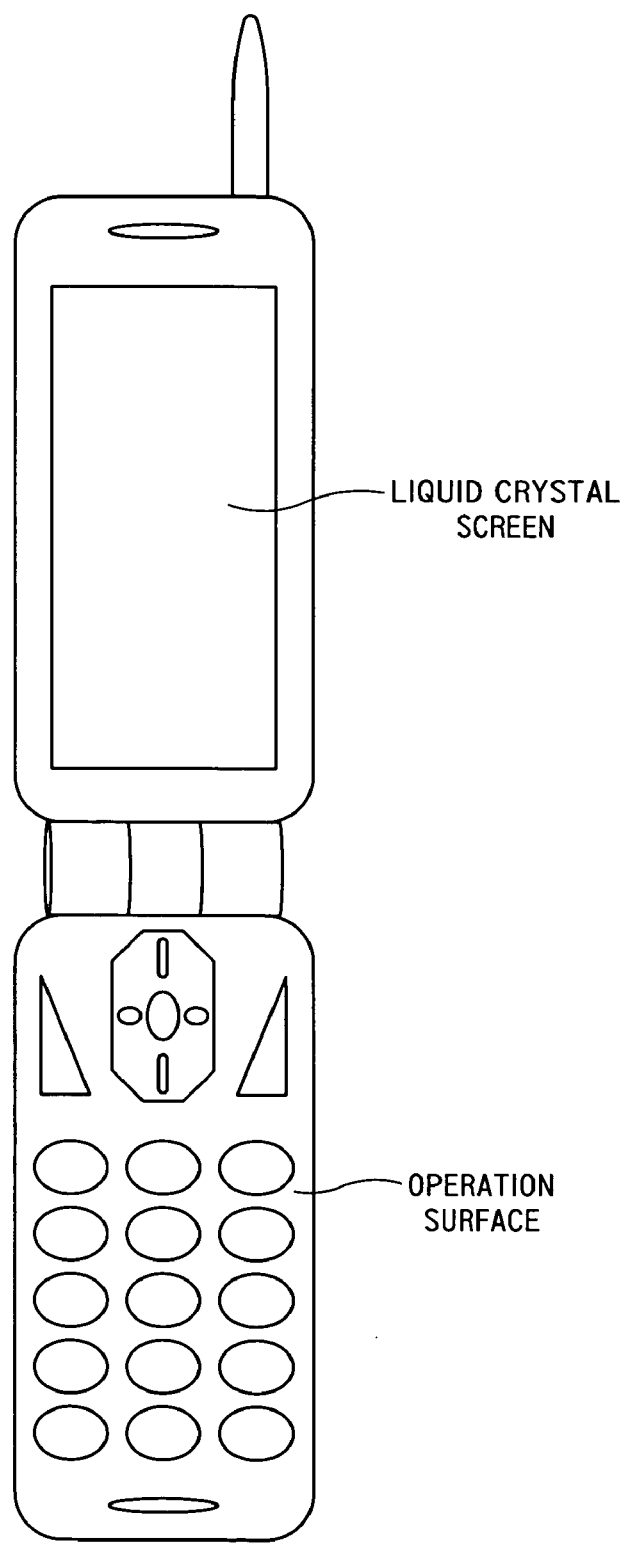
FIG. 20 is a schematic plan view of a mobile phone according to a ninth embodiment.

FIG. 20 is a schematic plan view of a mobile phone. The mobile phone is constituted by a liquid crystal screen and an operation surface (key section) separated from the liquid crystal screen. On both the sections, the brightnesses of the liquid crystal screen and the key section are controlled to cope with an external environment. For this purpose, an illuminance sensor according to the above embodiment serving as an embodiment of the present invention is incorporated in such a mobile phone.

On the operation section, a light of the operation section must be turned on/off at a low illuminance. On the liquid crystal screen, when an illuminance in a surrounding environment is high, the brightness of the liquid crystal screen must be suppressed to reduce a power consumption. Since the illuminance sensor according to any one of the embodiments described above is incorporated in the mobile phone to make it possible to accurately detect a low illuminance to a high illuminance, both the operation section and the liquid crystal screen can be controlled. When the illuminance sensor according to any one of the above embodiments is incorporated in the mobile phone, both ON/OFF-control of light-emitting diodes of the key section to be controlled at a low illuminance and brightness control of the liquid crystal screen to be controlled at a high illuminance can be effectively performed by a semiconductor photosensor (illuminance sensor) formed like one chip.

As described above, on an information device having a section which detects and controls low-illuminance incident light and a section which detects and controls high-illuminance light, an illuminance sensor which is formed on one chip and can detect an illuminance in a wide range is mounted. On the basis of the illuminance of the incident light detected by the illuminance sensor, objects to be controlled in the mobile device are controlled on the basis of the illuminance of the incident light detected by the illuminance sensor to make it possible to reduce a power consumption of the mobile device.

The embodiments of the present invention are described with reference to embodiments. However, combinations of these embodiments can be applied as the embodiments of the present invention.

For example, switches are arranged both a photodiode section and an amplifier, respectively to make it possible to set both the photodiode section and the amplifier as objects to be selected by the switches.

Each of the above embodiments describes the case in which a plurality of photodiode sections having different illuminance-output characteristics are independently arranged and the case in which a plurality of amplifiers having different gains are independently arranged. Since the area of a general amplifier is larger than the area of a general photodiode, the former is advantageous to a reduction in size of a semiconductor device.

The embodiments subsequent to the fifth embodiment, for example, in a mobile phone, a digital output semiconductor photosensor device, which can perform control of light-emitting diodes of a key section controlled at a low illuminance and brightness control of a liquid crystal screen controlled at a high illuminance without an external ADC, an ADC incorporating a CPU, or the like, can be provided. In these embodiments, an illumination light-emitting diode (LED) driver can also be directly turned on/off without a CPU.

What is claimed is:

1. A semiconductor photosensor device comprising:
   a plurality of photodiode sections having different illuminance-output characteristics;
   a switch which selects any one of the plurality of photodiode sections on a basis of an illuminance of incident light irradiated on the photodiode sections;
   an output section which outputs an output signal from the selected photodiode section through the switch;
   a mode detecting circuit which compares output voltages from the photodiode sections with a first reference voltage to control the switch by a first logic signal based on a first comparison comparison result in the mode detecting circuit;
   a comparator circuit which compares an output signal from one of the photodiode sections selected by the switch with a second reference voltage to output a second logic signal based on a second comparison result in the comparator circuit; and
a logic circuit connected to the mode detecting circuit and the comparator circuit and logically calculating the first logic signal and the second logic signal.

2. The semiconductor photosensor device according to claim 1, further comprising:
a storing section which stores a correction value for the first or second reference voltage to correct a variation between the semiconductor photosensor device and other semiconductor photosensor devices.

3. The semiconductor photosensor device according to claim 1, wherein
the plurality of photodiode sections include a first photodiode section and a second photodiode section,
the first photodiode section has an illuminance-output characteristic which is linear at an illuminance not more than a certain threshold illuminance, and
the second photodiode section has an illuminance-output characteristic which is linear at an illuminance exceeding the threshold illuminance.

4. The semiconductor photosensor device according to claim 3, wherein
the switch selects the first photodiode section when the output voltage is equal to or less than the reference voltage, and selects the second photodiode section when the output voltage is more than the reference voltage.

5. The semiconductor photosensor device according to claim 3, wherein
the second photodiode section comprises a neutral density filter at a light-receiving region of the second photodiode section.

6. The semiconductor photo sensor device according to claim 1, further comprising:
said mode detecting circuit controlling the switch to select a first photodiode section of the photodiode sections when the output voltage is equal to or less than the first reference voltage, the mode detecting circuit controlling the switch to select a second photodiode section of the photodiode sections when the output voltage is more than the first reference voltage.

7. A semiconductor photosensor device comprising:
a plurality of photodiode sections having different illuminance-output characteristics;
a switch which selects any one of the plurality of photodiode sections on the basis of an illuminance of incident light irradiated on the photodiode sections;
an output section which outputs an output signal from the selected photodiode section through the switch;
a mode detecting circuit which compares output voltages from the photodiode sections with a first reference voltage to control the switch by a first logic signal based on a first comparison result in the mode detecting circuit;
a comparator circuit which compares an output signal from one of the photodiode sections selected by the switch with second reference voltages which are different from each other to output a second logic signal consisting of a plurality of bits based on a second comparison result in the comparator circuit; and
a logic circuit connected to the mode detecting circuit and the comparator circuit and logically calculating the first logic signal and the second logic signal.

8. The semiconductor photosensor device according to claim 7, further comprising:
a storing section which stores a correction value for the first or second reference voltage to correct a variation between the semiconductor photosensor device and other semiconductor photosensor devices.

9. The semiconductor photosensor device according to claim 7, further comprising:
said mode detecting circuit controlling the switch to select a first photodiode section of the photodiode sections when the output voltage is equal to or less than the first reference voltage, the mode detecting circuit controlling the switch to select a second photodiode section of the photodiode sections when the output voltage is more than the first reference voltage.

10. The semiconductor photo sensor device according to claim 7, wherein
the plurality of photodiode sections include a first photodiode section and a second photodiode section,
the first photodiode section has an illuminance-output characteristic which is linear at an illuminance not more than a certain threshold illuminance, and
the second photodiode section has an illuminance-output characteristic which is linear at an illuminance exceeding the threshold illuminance.

11. The semiconductor photosensor device according to claim 10, wherein
the switch selects the first photodiode section when the output voltage is equal to or less than the reference voltage, and selects the second photodiode section when the output voltage is more than the reference voltage.

12. The semiconductor photosensor device according to claim 10, wherein
the second photodiode section comprises a neutral density filter at a light-receiving region of the second photodiode section.

13. An information apparatus incorporating a semiconductor photosensor device comprising:
a plurality of photodiode sections having different illuminance-output characteristics;
a switch which selects any one of the plurality of photodiode sections on a basis of an illuminance of incident light irradiated on the photodiode sections;
an output section which outputs an output signal from the selected photodiode section through the switch;
a mode detecting circuit which compares output voltages from the photodiode sections with a first reference voltage to control the switch by a first logic signal based on a first comparison result in the mode detecting circuit;
a comparator circuit which compares an output signal from one of the photodiode sections selected by the switch with a second reference voltage to output a second logic signal based on a second comparison result in the comparator circuit; and
a logic circuit connected to the mode detecting circuit and the comparator circuit, and logically calculating the first logic signal and the second logic signal.

14. The semiconductor photosensor device according to claim 13, further comprising:
a storing section which stores a correction value for the first or second reference voltage to correct a variation between the semiconductor photosensor device and other semiconductor photosensor devices.

15. The semiconductor photosensor device according to claim 13, wherein
the plurality of photodiode sections include a first photodiode section and a second photodiode section, the first photodiode section has an illuminance-output characteristic which is linear at an illuminance not more than a certain threshold illuminance, and the second photodiode section has an illuminance-output characteristic which is linear at an illuminance exceeding the threshold illuminance.

16. The semiconductor photosensor device according to claim 15, wherein the switch selects the first photodiode section when the output voltage is equal to or less than the reference voltage, and selects the second photodiode section when the output voltage is more than the reference voltage.

17. The semiconductor photosensor device according to claim 15, wherein the second photodiode section comprises a neutral density filter at a light-receiving region of the second photodiode section.

18. The semiconductor photosensor device according to claim 13, further comprising:

said mode detecting circuit controlling the switch to select a first photodiode section of the photodiode sections when the output voltage is equal to or less than the first reference voltage, the mode detecting circuit controlling the switch to select a second photodiode section of the photodiode sections when the output voltage is more than the first reference voltage.

19. An information apparatus incorporating a semiconductor photosensor device comprising:

a plurality of photodiode sections having different illuminance-output characteristics;

a switch which selects any one of the plurality of photodiode sections on a basis of an illuminance of incident light irradiated on the photodiode sections;

an output section which outputs an output signal from the selected photodiode section through the switch;

a mode detecting circuit which compares output voltages from the photodiode sections with a first reference voltage to control the switch by a first logic signal based on a first comparison comparison result in the mode detecting circuit;

a comparator circuit which compares an output signal from one of the photodiode sections selected by the switch with a second reference voltage which are different from each other to output a second logic signal consisting of a plurality of bits based on a second comparison result in the comparator circuit; and a logic circuit connected to the mode detecting circuit and the comparator circuit, and logically calculating the first logic signal and the second logic signal.

20. The semiconductor photosensor device according to claim 19, further comprising:

a storing section which stores a correction value for the first or second reference voltage to correct a variation between the semiconductor photosensor device and other semiconductor photosensor devices.

21. The semiconductor photosensor device according to claim 19, wherein the plurality of photodiode sections include a first photodiode section and a second photodiode section, the first photodiode section has an illuminance-output characteristic which is linear at an illuminance not more than a certain threshold illuminance, and the second photodiode section has an illuminance-output characteristic which is linear at an illuminance exceeding the threshold illuminance.

22. The semiconductor photosensor device according to claim 21, wherein the switch selects the first photodiode section when the output voltage is equal to or less than the reference voltage, and selects the second photodiode section when the output voltage is more than the reference voltage.

23. The semiconductor photosensor device according to claim 21, wherein the second photodiode section comprises a neutral density filter at a light-receiving region of the second photodiode section.

24. The semiconductor photosensor device according to claim 19, further comprising:

said mode detecting circuit controlling the switch to select a first photodiode section of the photodiode sections when the output voltage is equal to or less than the first reference voltage, the mode detecting circuit controlling the switch to select a second photodiode section of the photodiode sections when the output voltage is more than the first reference voltage.

* * * * *